(12) United States Patent
Chou et al.

(10) Patent No.: US 11,538,400 B2
(45) Date of Patent: Dec. 27, 2022

(54) LIGHT-EMITTING DIODE DISPLAY AND METHOD FOR FABRICATING THE SAME

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Hsien Ying Chou, Shenzhen (CN); Po Lun Chen, Shenzhen (CN); Chun Ta Chen, Shenzhen (CN); Po Ching Lin, Shenzhen (CN)

(73) Assignees: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (CN)

( * ) Notice: Subject to any disclaimer, the term of this patent is extended or adjusted under 35 U.S.C. 154(b) by 42 days.

(21) Appl. No.: 17/171,271

(22) Filed: Feb. 9, 2021

(65) Prior Publication Data

US 2022/0198996 A1     Jun. 23, 2022

(30) Foreign Application Priority Data

Dec. 22, 2020   (CN) .......................... 202011529827.3

(51) Int. Cl.
G09G 3/32       (2016.01)
H01L 25/075     (2006.01)
(Continued)

(52) U.S. Cl.
CPC .............. *G09G 3/32* (2013.01); *H01L 22/22* (2013.01); *H01L 25/0753* (2013.01);
(Continued)

(58) Field of Classification Search
CPC ....... G09G 3/32; H01L 22/22; H01L 25/0753; H01L 33/0095; H01L 33/62; H01L 2933/0066
See application file for complete search history.

(56) References Cited

U.S. PATENT DOCUMENTS 7,544,977 B2 *   6/2009   Snider ................. H01L 29/0676
                                                         257/211
7,692,215 B2 *   4/2010   Williams ............ H01L 29/0673
                                                         257/773
(Continued)

FOREIGN PATENT DOCUMENTS

EP      2096672 B1 *   8/2011   ............. B82Y 10/00
TW    202002232 A  *   1/2020   ................ F21V 9/08
(Continued)

*Primary Examiner* — Vinh T Lam
(74) *Attorney, Agent, or Firm* — Rosenberg Klein & Lee

(57) ABSTRACT

A light-emitting diode display and a method for fabricating the same is disclosed. The light-emitting diode display includes a driving backplane and a plurality of pixel units. Each of the plurality of pixel units includes at least one light-emitting diode and a package substrate. The top surface of the package substrate has at least one conductive position and at least one conductive vacant position corresponding to the at least one conductive position. The conductive position is provided with the light-emitting diode. The conductive position is electrically connected to the light-emitting diode. The bottom surface of the package substrate of each pixel unit is arranged on the driving backplane. The driving backplane is electrically connected to the light-emitting diode and the corresponding conductive vacant position of each pixel unit thereon.

17 Claims, 36 Drawing Sheets

(51) Int. Cl.
   *H01L 21/66*     (2006.01)
   *H01L 33/00*     (2010.01)
   *H01L 33/62*     (2010.01)
(52) U.S. Cl.
   CPC .......... *H01L 33/0095* (2013.01); *H01L 33/62* (2013.01); *H01L 2933/0066* (2013.01)

(56) References Cited

U.S. PATENT DOCUMENTS

| | | | |
|---|---|---|---|
| 7,833,842 B2 * | 11/2010 | Williams | B82Y 10/00 438/129 |
| 8,344,475 B2 * | 1/2013 | Shaeffer | G11C 16/26 257/E21.328 |
| 8,642,416 B2 * | 2/2014 | Or-Bach | H01L 21/84 438/455 |
| 9,029,173 B2 * | 5/2015 | Or-Bach | H01L 27/088 438/17 |
| 9,219,005 B2 * | 12/2015 | Or-Bach | G11C 16/0408 |
| 9,509,313 B2 * | 11/2016 | Or-Bach | H03K 19/17736 |
| 9,647,048 B2 * | 5/2017 | Chang | H01L 27/3262 |
| 10,098,197 B2 * | 10/2018 | van de Ven | H05B 45/56 |
| 10,304,364 B2 * | 5/2019 | Chaji | G09G 3/006 |
| 10,991,307 B2 * | 4/2021 | Wang | G09G 3/3233 |
| 11,004,836 B2 * | 5/2021 | Bibi | H01L 33/30 |
| 2020/0035750 A1 * | 1/2020 | Li | G09G 3/3208 |
| 2020/0168585 A1 * | 5/2020 | Lo | H01L 25/0753 |
| 2021/0359155 A1 * | 11/2021 | Chaji | H01L 33/0095 |
| 2021/0407411 A1 * | 12/2021 | Yang | G09G 3/3233 |

FOREIGN PATENT DOCUMENTS

| | | | | |
|---|---|---|---|---|
| WO | WO-2012015550 A2 * | 2/2012 | ............ | B82Y 10/00 |
| WO | WO-2012015550 A9 * | 5/2012 | ............ | B82Y 10/00 |

* cited by examiner

LIGHT-EMITTING DIODE DISPLAY AND METHOD FOR FABRICATING THE SAME

BACKGROUND OF THE INVENTION

This application claims priority of Application No. 202011529827.3 filed in China on 22 Dec. 2020 under 35 U.S.C. § 119; the entire contents of all of which are hereby incorporated by reference.

FIELD OF THE INVENTION

The present invention relates to the technology for fabricating a display, particularly to a light-emitting diode display and a method for fabricating the same.

DESCRIPTION OF THE RELATED ART

Light-emitting diodes (LEDs) are regarded as a new generation of display technology. A large number of domestic and foreign manufacturers have aggressively developed LEDs. The market prospects of LEDs are highly promising. LEDs have advantages of micro-scale spacing, high brightness, low power consumption, high resolution, high color saturation, etc. The main advantage of the light-emitting diode comes from its main feature. Each sub-pixel of a LED display panel can be controlled via addressing and individually driven to emit light.

Mass transfer is the most critical in the fabrication process. Mass transfer does not transfer one micro light emitting diode at a time. Instead, many manufacturers presently use mass transfer, which transfers a large number of LEDs from a growth substrate, such as sapphire substrate or a GaAs substrate, to a thin-film substrate or a circuit substrate, wherein the spacing among the LEDs corresponds to the pixel pitch of the display. In mass transfer, LED dies easily fall off, shift in position or have non-wetting solder, so as not to emit light. Since the size of the die is scaled down to below 30 μm, it is very difficult to repair and replace LEDs between the original solder joints. As a result, the positions to be repaired are reserved on a driving backplane and the failed LED dies are removed. Then, new LED dies are directly transferred to the reserved positions to be repaired. Although the reserved positions to be repaired can be used to solve the problem with repairing failed LED dies in mass transfer, the reserved positions increase the complexity of designing circuits and affect the area utilization of a high-resolution display screen in the future.

To overcome the abovementioned problems, the present invention provides a light-emitting diode display and a method for fabricating the same, so as to solve the aforementioned problems of the prior art.

SUMMARY OF THE INVENTION

The present invention provides a light-emitting diode display and a method for fabricating the same, which increase the utilization of light emitting areas and have applications of high-resolution products. Besides, a package substrate can transfer many LEDs to a driving backplane to decrease the transferring times and increase the transferring success rate.

In an embodiment of the present invention, a light-emitting diode display includes a driving backplane and a plurality of pixel units. Each of the plurality of pixel units includes at least one light-emitting diode and at least one package substrate. The top surface of the package substrate has at least one conductive position and at least one conductive vacant position. The conductive vacant position corresponds to the conductive position. The conductive position is provided with the corresponding light-emitting diode. The conductive position is electrically connected to the corresponding light-emitting diode. The bottom surface of the package substrate of each of the plurality of pixel units is arranged on the driving backplane. The driving backplane is electrically connected to the light-emitting diode and the corresponding conductive vacant position of each of the plurality of pixel units thereon.

In an embodiment of the present invention, the light-emitting diode is a red light-emitting diode, a green light-emitting diode, or a blue light-emitting diode.

In an embodiment of the present invention, the light-emitting diode display further includes at least one backup light-emitting diode arranged at the conductive vacant position and electrically connected to the driving backplane.

In an embodiment of the present invention, the conductive position includes a plurality of conductive positions. The light-emitting diode includes a plurality of light-emitting diodes. The plurality of light-emitting diodes are respectively arranged at the plurality of conductive positions and respectively electrically connected to the plurality of conductive positions. The number of the plurality of light-emitting diodes is equal to the number of the plurality of conductive positions.

In an embodiment of the present invention, the plurality of light-emitting diodes include red light-emitting diodes, green light-emitting diodes, and blue light-emitting diodes.

In an embodiment of the present invention, the conductive vacant position includes a plurality of conductive vacant positions. The plurality of conductive vacant positions respectively correspond to the plurality of conductive positions. The number of the plurality of conductive vacant positions is equal to the number of the plurality of conductive positions.

In an embodiment of the present invention, the light-emitting diode is a mini light-emitting diode or a micro light-emitting diode.

In an embodiment of the present invention, each of the plurality of pixel units further includes at least one voltage compensation circuit and an integrated circuit. The integrated circuit is arranged between the package substrate and the voltage compensation circuit and arranged at the conductive position and the corresponding conductive vacant position. The voltage compensation circuit is arranged between the integrated circuit and the light-emitting diode and arranged directly above the conductive position and the corresponding conductive vacant position. The light-emitting diode is electrically connected to the conductive position through the voltage compensation circuit and the integrated circuit. The voltage compensation circuit is electrically connected to the corresponding conductive vacant position through the integrated circuit. The integrated circuit is configured to generate at least one control voltage. The voltage compensation circuit is configured to receive the control voltage, perform voltage compensation on the control voltage to generate at least one display voltage, and transmit the display voltage to the light-emitting diode.

In an embodiment of the present invention, the at least one package substrate includes a first package substrate and a second package substrate. The top surface of the first package substrate has the conductive position. The top surface of the second package substrate has the conductive vacant position. The bottom surfaces of the first package substrate and the second package substrate are arranged on the driving backplane. The driving backplane is electrically connected to the light-emitting diode thereon and the corresponding conductive vacant position.

In an embodiment of the present invention, each of the plurality of pixel units further includes at least one first voltage compensation circuit and a first integrated circuit. The first integrated circuit is arranged between the first package substrate and the first voltage compensation circuit and arranged at the conductive position. The first voltage compensation circuit is arranged between the first integrated circuit and the light-emitting diode and arranged directly above the conductive position. The light-emitting diode is electrically connected to the conductive position through the first voltage compensation circuit and the first integrated circuit. The first integrated circuit is configured to generate at least one first control voltage. The first voltage compensation circuit is configured to receive the first control voltage, perform voltage compensation on the first control voltage to generate at least one first display voltage, and transmit the first display voltage to the light-emitting diode.

In an embodiment of the present invention, each of the plurality of pixel units further includes at least one second voltage compensation circuit and a second integrated circuit. The second integrated circuit is arranged between the second package substrate and the second voltage compensation circuit and arranged at the conductive vacant position. The second voltage compensation circuit is arranged on the second integrated circuit and arranged directly above the conductive vacant position. The second voltage compensation circuit is electrically connected to the corresponding conductive vacant position through the second integrated circuit. The second integrated circuit is configured to generate at least one second control voltage. The second voltage compensation circuit is configured to receive the second control voltage, perform voltage compensation on the second control voltage to generate at least one second display voltage, and transmit the second display voltage to the conductive vacant position.

In an embodiment of the present invention, the method for fabricating a light-emitting diode display includes: providing a plurality of pixel units, wherein each of the plurality of pixel units includes at least one package substrate and at least one light-emitting diode, the top surface of the package substrate has at least one conductive position and at least one conductive vacant position, the conductive vacant position corresponds to the conductive position, the conductive position is provided with the corresponding light-emitting diode, and the conductive position is electrically connected to the corresponding light-emitting diode; and transferring the bottom surface of the package substrate to a driving backplane and electrically connecting the driving backplane to the light-emitting diode thereon and the corresponding conductive vacant position.

In an embodiment of the present invention, after the step of providing the plurality of pixel units, determining whether the package substrate and the light-emitting diode thereon of each of the plurality of pixel units are normal: if yes, transferring the bottom surface of the normal package substrate to the driving backplane and electrically connecting the driving backplane to the light-emitting diode thereon and the corresponding conductive vacant position; and if no, separating the abnormal package substrate from the driving backplane.

In an embodiment of the present invention, in the step of transferring the bottom surface of the normal package substrate to the driving backplane and electrically connecting the driving backplane to the light-emitting diode thereon and the corresponding conductive vacant position, the bottom surface of the package substrate of each of the plurality of pixel units to the driving backplane and the driving backplane is electrically connected to the conductive vacant position of each of the plurality of pixel units and the light-emitting diode of each of the plurality of pixel units.

In an embodiment of the present invention, the light-emitting diode is a red light-emitting diode, a green light-emitting diode, or a blue light-emitting diode.

In an embodiment of the present invention, the method further includes: determining whether the light-emitting diode electrically connected to the driving backplane emits light: if no, transferring at least one backup light-emitting diode to the conductive vacant position and electrically connecting the driving backplane to the backup light-emitting diode thereon; and if yes, ending.

In an embodiment of the present invention, the at least one conductive position includes a plurality of conductive positions. The at least one light-emitting diode includes a plurality of light-emitting diodes. The plurality of light-emitting diodes are respectively arranged at the plurality of conductive positions and respectively electrically connected to the plurality of conductive positions. The number of the plurality of light-emitting diodes is equal to the number of the plurality of conductive positions.

In an embodiment of the present invention, the plurality of light-emitting diodes include red light-emitting diodes, green light-emitting diodes, and blue light-emitting diodes.

In an embodiment of the present invention, the at least one conductive vacant position includes a plurality of conductive vacant positions. The plurality of conductive vacant positions respectively correspond to the plurality of conductive positions. The number of the plurality of conductive vacant positions is equal to the number of the plurality of conductive positions.

In an embodiment of the present invention, the light-emitting diode is a mini light-emitting diode or a micro light-emitting diode.

In an embodiment of the present invention, the at least one package substrate includes a first package substrate and a second package substrate. The top surface of the first package substrate has the conductive position. The top surface of the second package substrate has the conductive vacant position. In the step of transferring the bottom surface of the at least one package substrate to the driving backplane, the bottom surfaces of the first package substrate and the second package substrate are transferred to the driving backplane.

In an embodiment of the present invention, after the step of providing the plurality of pixel units, determining whether the first package substrate and the light-emitting diode thereon of each of the plurality of pixel units are normal: if yes, transferring the bottom surfaces of the normal first package substrate and the corresponding second package substrate to the driving backplane and electrically connecting the driving backplane to the light-emitting diode thereon and the corresponding conductive vacant position; and if no, separating the abnormal first package substrate and the corresponding second package substrate from the driving backplane.

In an embodiment of the present invention, in the step of transferring the bottom surface of the package substrate to the driving backplane and electrically connecting the driving backplane to the light-emitting diode thereon and the corresponding conductive vacant position, the bottom surfaces of the first package substrates and the second package substrates of the plurality of pixel units are transferred to the driving backplane and the driving backplane is electrically connected to the light-emitting diode and the conductive vacant position of each of the plurality of pixel units.

To sum up, the light-emitting diode display and the method for fabricating the same arrange the package substrate between the driving backplane and LEDs and transfer the circuit of the driving backplane to the package substrate to increase the utilization of light emitting areas and have applications of high-resolution products. Besides, the package substrate can transfer many LEDs to the driving backplane to decrease the transferring times and increase the transferring success rate.

DETAILED DESCRIPTION OF THE INVENTION

Figure 1:
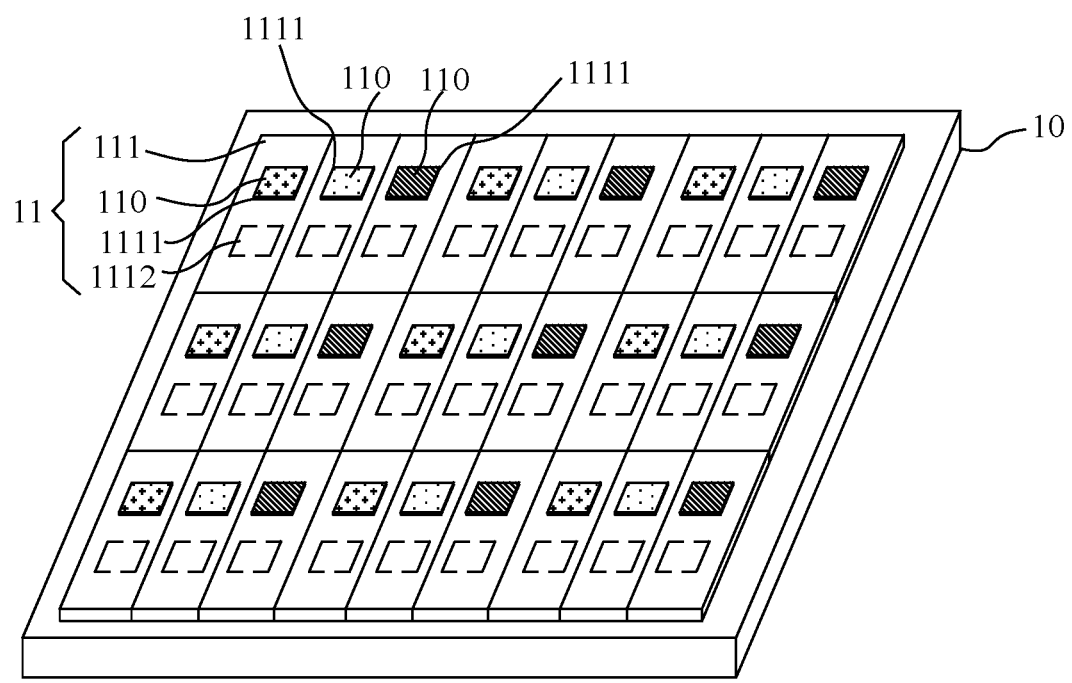
FIG. 1 is a perspective view of a light-emitting diode display according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the present invention will be discussed to guide practitioners about the present invention. Every example in the present specification cannot limit the claimed scope of the present invention.

Besides, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Furthermore, it can be understood that the terms "comprising," "including," "having," "containing," and "involving" are open-ended terms, which refer to "may include but is not limited to so." Besides, each of the embodiments or claims of the present invention is not necessary to achieve all the effects and advantages possibly to be generated, and the abstract and title of the present invention is used to assist for patent search and is not used to further limit the claimed scope of the present invention.

FIG. 1 is a perspective view of a light-emitting diode display according to a first embodiment of the present invention. Referring to FIG. 1, the light-emitting diode display 1 according to a first embodiment of the present invention is introduced as follows. The light-emitting diode display 1 includes a driving backplane 10 and a plurality of pixel units 11. Each pixel unit 11 includes at least one light-emitting diode (LED) 110 and at least one package substrate 111. The light-emitting diode 110 includes, but not limited to, a red light-emitting diode, a green light-emitting diode, or a blue light-emitting diode. Besides, the size of the light-emitting diode 110 is not limited. The light-emitting diode 110 may be a mini light-emitting diode or a micro light-emitting diode. As illustrated in FIG. 1, the light-emitting diodes 110 have different cross-section lines that respectively represent different-color light-emitting diodes. The top surface of the package substrate 111 has at least one conductive position 1111 and at least one conductive vacant position 1112. The conductive vacant position 1112 corresponds to the conductive position 1111. In the first embodiment, one light-emitting diode 110, one package substrate 111, one conductive position 1111, and one conductive vacant position 1112 of each pixel unit 11 are used, but the present invention is not limited thereto. The conductive position 1111 is provided with the light-emitting diode 110 thereon. The conductive position 1111 is electrically connected to the light-emitting diode 110 thereon. The bottom surface of the package substrate 111 of each pixel unit 11 is arranged on the driving backplane 10. The driving backplane 10 is electrically connected to the light-emitting diode 110 and the corresponding conductive vacant position 1112 of each pixel unit 11 thereon. In the conventional technology, the spacing among LEDs is larger since the LEDs do not cover the circuits of the driving backplane. In the present invention, the package substrate 111 is arranged between the driving backplane 10 and the light-emitting diode 110. Thus, the circuit of the driving backplane 10 is transferred to the package substrate 111 to decrease the complexity of circuits of the driving backplane 10. As a result, the light-emitting diodes 110 can be closely arranged to increase the utilization of light emitting areas. Accordingly, the light-emitting diode display 1 has applications of high-resolution products.

Figure 2:
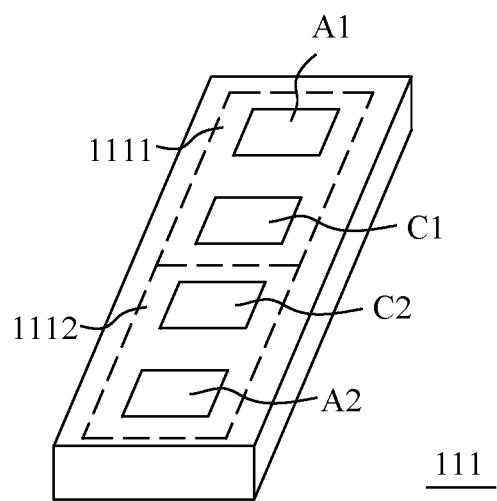
FIG. 2 is a diagram schematically illustrating the top surface of a package substrate according to an embodiment of the present invention.
Figure 3:
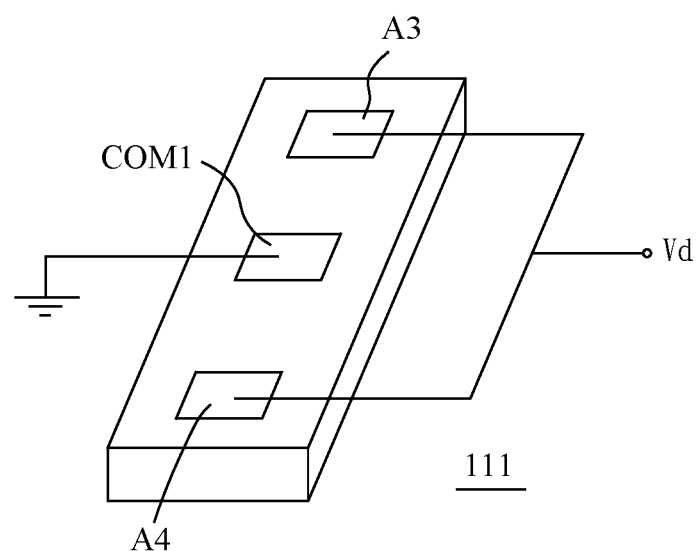
FIG. 3 is a diagram schematically illustrating the bottom surface of a package substrate according to an embodiment of the present invention.
Figure 4:
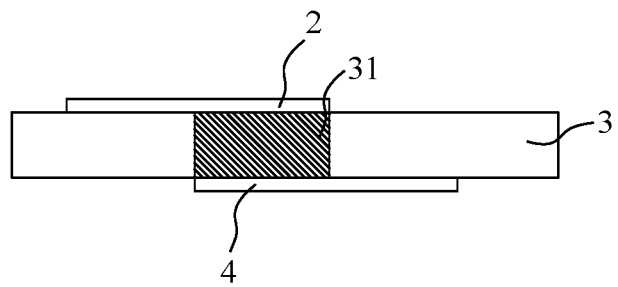
FIG. 4 is a cross-sectional view of a through silicon via (TSV) of the present invention.
Figure 5:
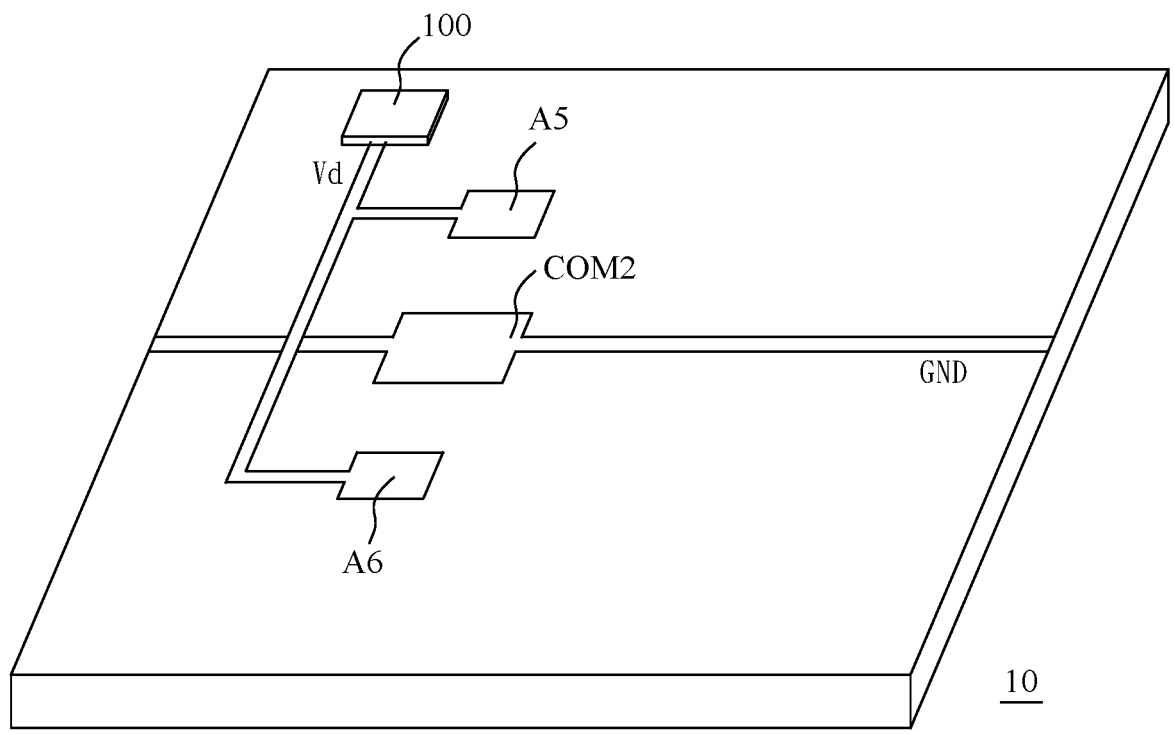
FIG. 5 is a perspective view of a driving backplane according to an embodiment of the present invention.
Figure 6:
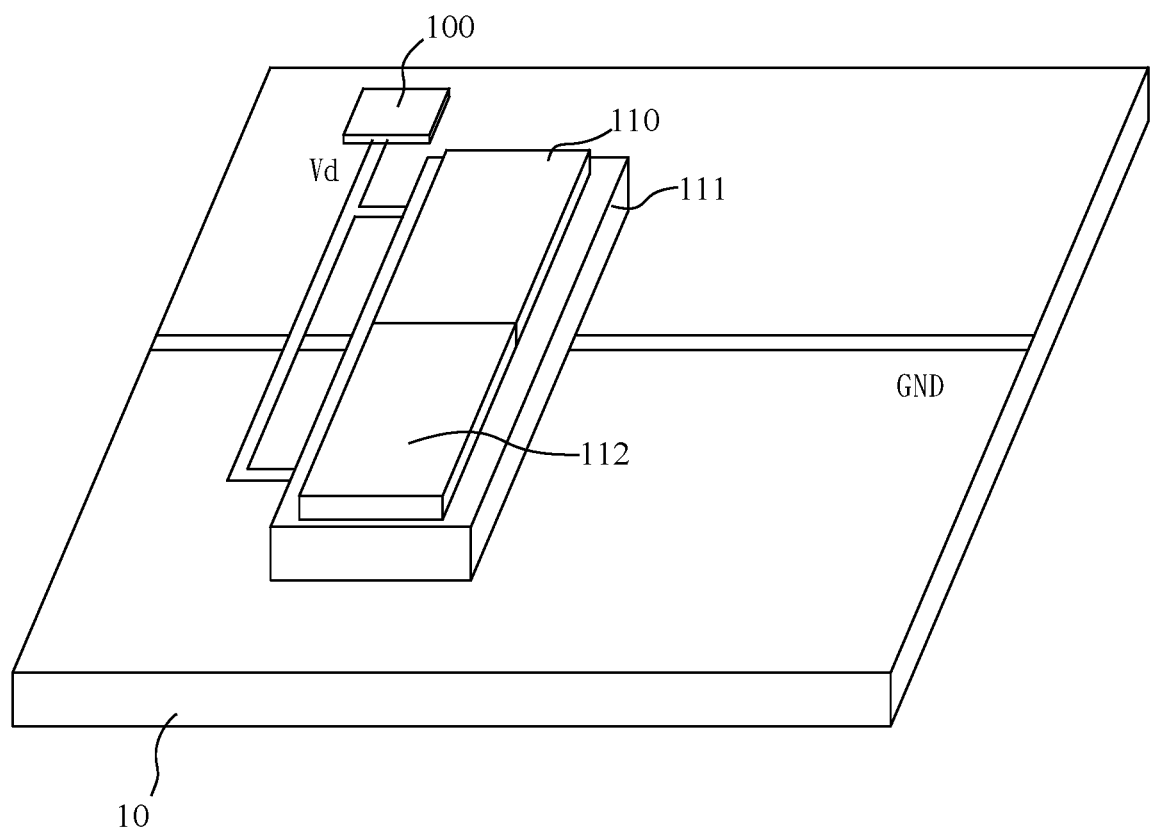
FIG. 6 is a perspective view of a LED, a backup LED, and a package substrate on the driving backplane according to an embodiment of the present invention.
Figure 7:
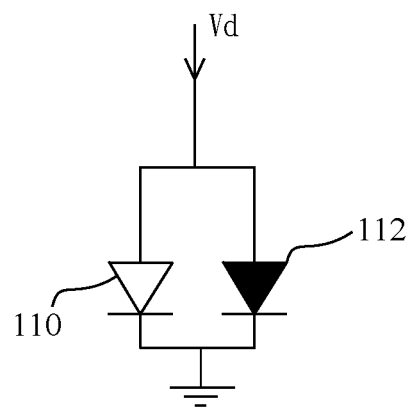
FIG. 7 is a diagram schematically illustrating an equivalent circuit corresponding to FIG. 6 according to the first embodiment of the present invention.

FIG. 2 is a diagram schematically illustrating the top surface of a package substrate according to an embodiment of the present invention. FIG. 3 is a diagram schematically illustrating the bottom surface of a package substrate according to an embodiment of the present invention. FIG. 4 is a cross-sectional view of a through silicon via (TSV) of the present invention. FIG. 5 is a perspective view of a driving backplane according to an embodiment of the present invention. FIG. 6 is a perspective view of a LED, a backup LED, and a package substrate on the driving backplane according to an embodiment of the present invention. FIG. 7 is a diagram schematically illustrating an equivalent circuit corresponding to FIG. 6 according to the first embodiment of the present invention. Referring to FIG. 2, FIG. 3, FIG. 4, FIG. 5, FIG. 6, and FIG. 7, one light-emitting diode 110, one package substrate 111, one conductive position 1111, and one conductive vacant position 1112 of each pixel unit 11 are used to describe the structure of the light-emitting diode display 1. In an embodiment of the present invention, the conductive position 1111 may have a first anode A1 and a first cathode C1. The conductive vacant position 1112 may have a second anode A2 and a second cathode C2. The bottom surface of the package substrate 111 may have at least one third anode A3, at least one fourth anode A4, and a first common cathode COM1. The number of the third anode A3 is equal to the number of the conductive position 1111. The number of the fourth anode A4 is equal to the number of the conductive vacant position 1112. The first anode A1 is electrically connected to the third anode A3. The second anode A2 is electrically connected to the fourth anode A4. The first cathode C1 and the second cathode C2 are electrically connected to the first common cathode COM1. The first anode A1 and the first cathode C1 are provided with and electrically connected to the light-emitting diode 110 thereon. In other words, the conductive pads of the light-emitting diode 110 are arranged at the same side. The above-mentioned electrodes are electrically connected to each other using the through silicon via (TSV) technology. For example, as illustrated in FIG. 4, a top electrode 2 is electrically connected to a bottom electrode 4 through the TSV 31 of a silicon substrate 3. In an embodiment of the present invention, the surface of the driving backplane 10 may have at least one fifth anode A5, at least one sixth anode A6, and a second common cathode COM2. The number of the fifth anode A5 is equal to the number of the conductive position 1111. The number of the sixth anode A6 is equal to the number of the conductive vacant position 1112. The fifth anode A5 is electrically connected to the sixth anode A6. The third anode A3 is electrically connected to the fifth anode A5. The fourth anode A4 is electrically connected to the sixth anode A6. The first common cathode COM1 is electrically connected to the second common cathode COM2. Thus, the driving backplane 10 is electrically connected to the light-emitting diodes 110 thereon and the corresponding conductive vacant positions 1112. The driving backplane 10 includes a driver integrated circuit (IC) 100. The driver IC 100 is electrically connected to the first anode A1, the second anode A2, the third anode A3, the fourth anode A4, the fifth anode A5, the sixth anode A6, and the light-emitting diode 110. The driver IC 100 provides a driving voltage Vd for the light-emitting diode 110 and the second anode A2. Since the second common cathode COM2 receives a grounding voltage GND, the second common cathode COM2 transmits the grounding voltage GND to the light-emitting diode 110 and the second cathode C2. When the light-emitting diode 110 fails, the light-emitting diode display 1 may further include at least one backup light-emitting diode 112 that is arranged at the conductive vacant position 1112 corresponding to the failed light-emitting diode 110. The driving backplane 10 is electrically connected to the backup light-emitting diode 112 thereon. Specifically, the backup light-emitting diode 112 is arranged on and electrically connected to the second anode A2 and the second cathode C2. The backup light-emitting diode 112 receives the driving voltage Vd and the grounding voltage GND. As a result, the conductive pads of the backup light-emitting diode 112 are also arranged at the same side.

Figure 8:
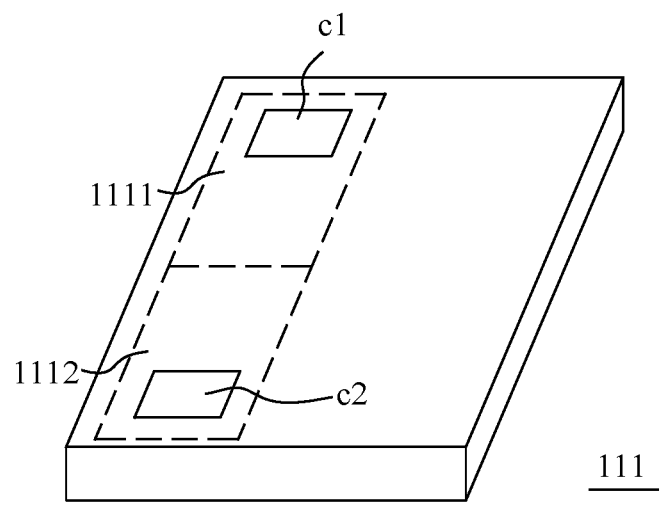
FIG. 8 is a diagram schematically illustrating the top surface of a package substrate according to another embodiment of the present invention.
Figure 9:
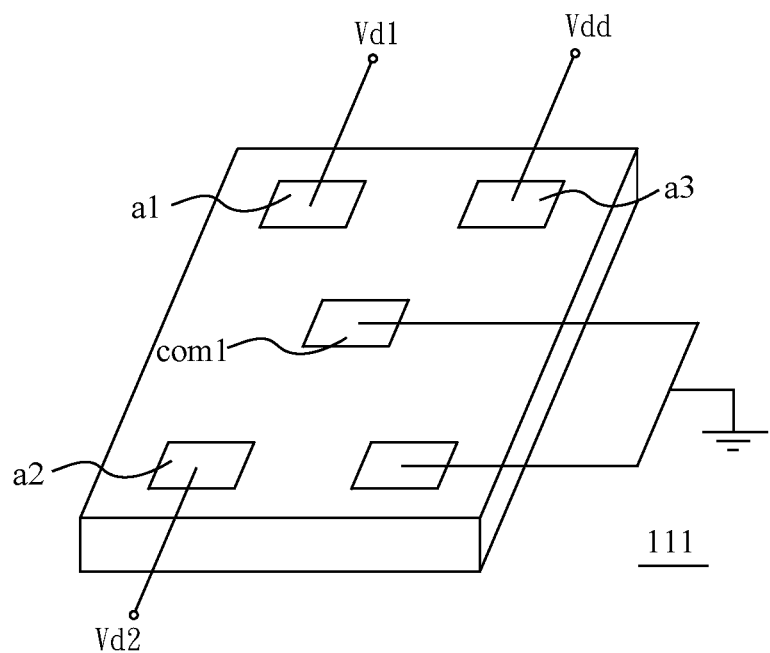
FIG. 9 is a diagram schematically illustrating the bottom surface of a package substrate according to another embodiment of the present invention.
Figure 10:
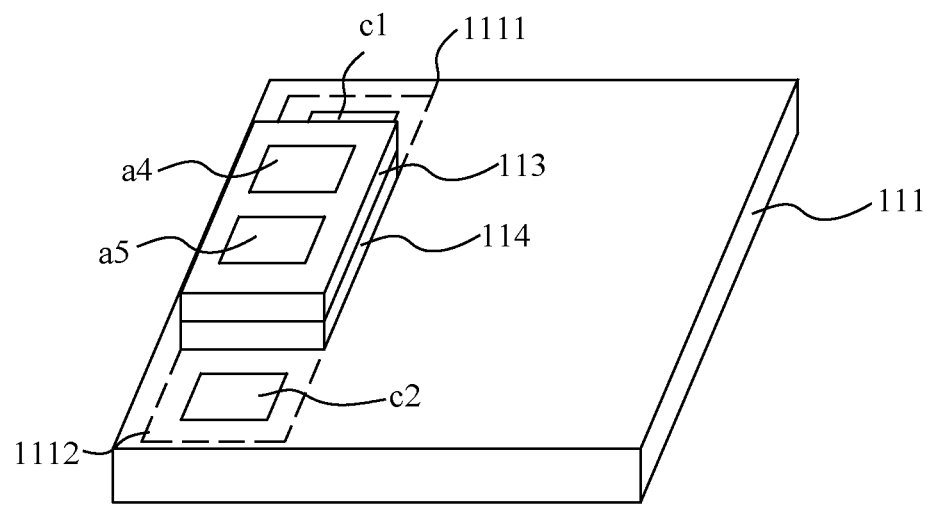
FIG. 10 is a perspective view of an IC and a voltage compensation circuit on the package backplane according to an embodiment of the present invention.
Figure 11:
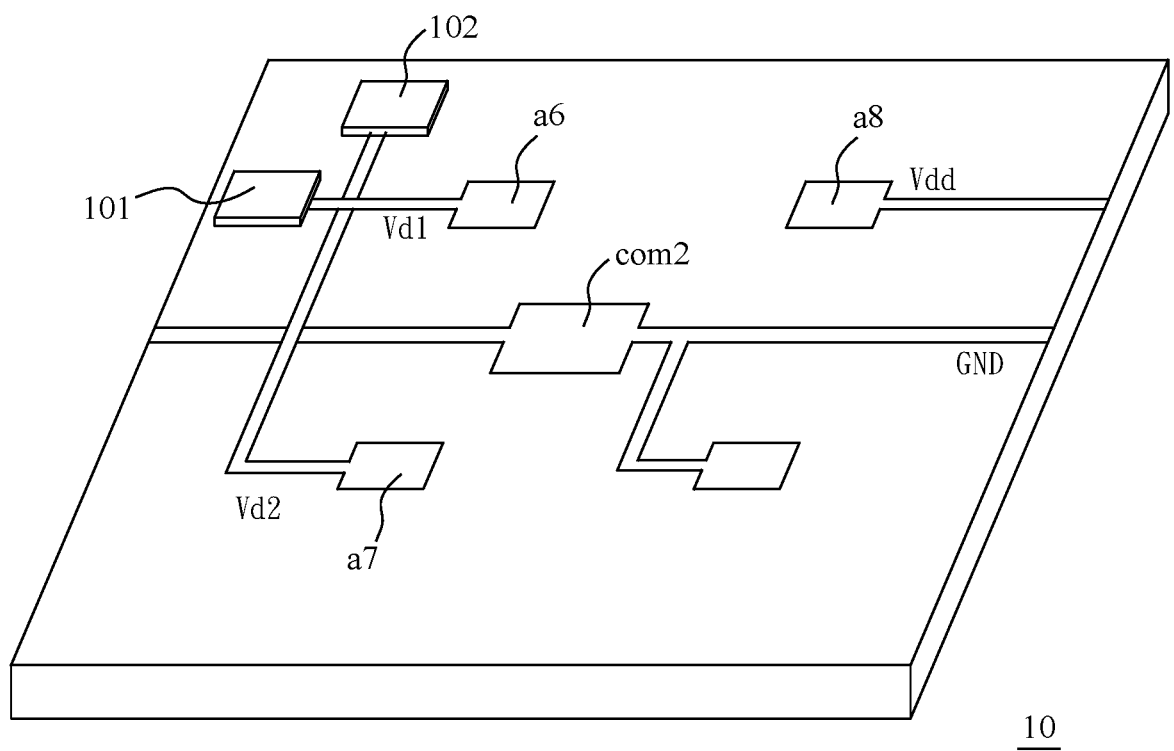
FIG. 11 is a perspective view of a driving backplane according to another embodiment of the present invention.
Figure 12:
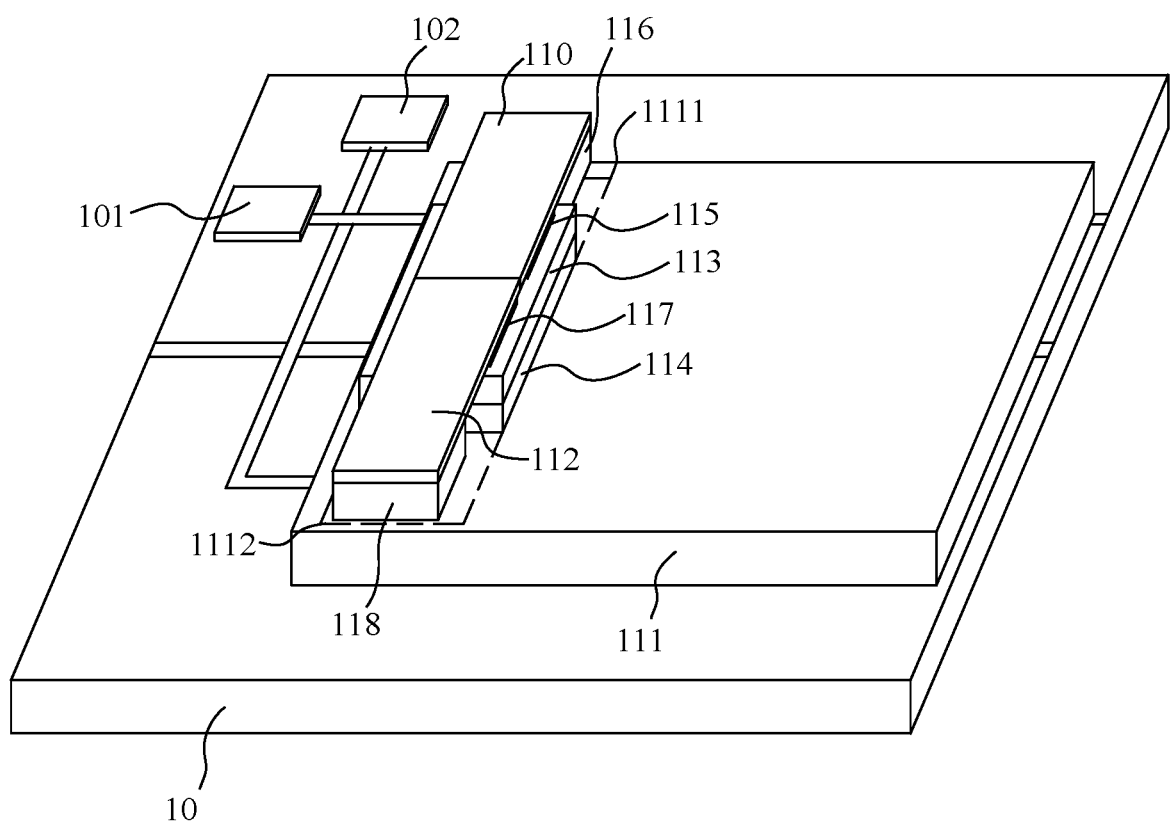
FIG. 12 is a perspective view of a LED, a backup LED, an IC, a voltage compensation circuit, and a package substrate on the driving backplane according to an embodiment of the present invention.
Figure 13:
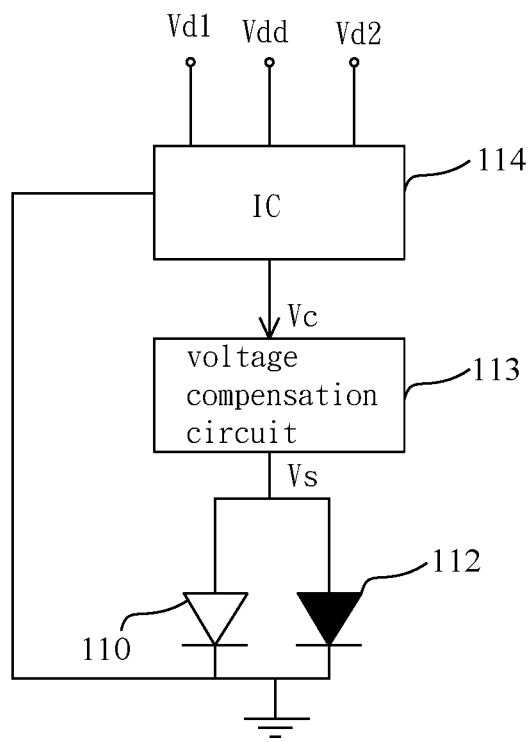
FIG. 13 is a diagram schematically illustrating an equivalent circuit corresponding to FIG. 12 according to the first embodiment of the present invention.

FIG. 8 is a diagram schematically illustrating the top surface of a package substrate according to another embodiment of the present invention. FIG. 9 is a diagram schematically illustrating the bottom surface of a package substrate according to another embodiment of the present invention. FIG. 10 is a perspective view of an IC and a voltage compensation circuit on the package backplane according to an embodiment of the present invention. FIG. 11 is a perspective view of a driving backplane according to another embodiment of the present invention. FIG. 12 is a perspective view of a LED, a backup LED, an IC, a voltage compensation circuit, and a package substrate on the driving backplane according to an embodiment of the present invention. FIG. 13 is a diagram schematically illustrating an equivalent circuit corresponding to FIG. 12 according to the first embodiment of the present invention. Referring to FIG. 8, FIG. 9, FIG. 10, FIG. 11, FIG. 12, and FIG. 13, one light-emitting diode 110, one package substrate 111, one conductive position 1111, and one conductive vacant position 1112 of each pixel unit 11 are used to describe the structure of the light-emitting diode display 1. In another embodiment of the present invention, each pixel unit 11 further includes at least one voltage compensation circuit 113 and an IC 114. In the first embodiment, the numbers of the light-emitting diode 110 and the voltage compensation circuit 113 of the pixel unit 11 are equal. The IC 114 is arranged between the package substrate 111 and the voltage compensation circuit 113. The IC 114 is arranged at the conductive position 1111 and the corresponding conductive vacant position 1112. The voltage compensation circuit 113 is arranged between the IC 114 and the light-emitting diode 110 and directly arranged over the conductive position 1111 and the corresponding conductive vacant position 1112. The light-emitting diode 110 is electrically connected to the conductive position 1111 through the voltage compensation circuit 113 and the IC 114. The voltage compensation circuit 113 is electrically connected to the corresponding conductive vacant position 1112 through the IC 114. The positions of the IC 114 and the voltage compensation circuit 113 are not limited. In some embodiments of the present invention, the IC 114 and the voltage compensation circuit 113 may be directly arranged on the surface of the package substrate 111. The IC 114 is configured to generate at least one control voltage Vc. The voltage compensation circuit 113 is configured to receive the control voltage Vc and perform voltage compensation on the control voltage Vc to generate at least one display voltage Vs. The voltage compensation circuit 113 transmits the display voltage Vs to the light-emitting diode 110. For example, the numbers of the control voltage Vc, the display voltage Vs, the light-emitting diode 110 of the pixel unit 11 are equal. Since the current corresponding to the control voltage Vc is affected by the threshold voltage and the mobility of the thin-film transistor, the driving voltage of the light-emitting diode 110, and the voltage of power supply, the voltage compensation circuit 113 may include capacitors, resistors, and inductors to eliminate influence caused by these factors, such as the variation of the threshold voltage of the thin-film transistor, the voltage drop across the conductive trace, and the shift of the threshold voltage of the light-emitting diode 110.

Specifically, the conductive position 1111 may have a first cathode c1 and the conductive vacant position 1112 may have a second cathode c2. The bottom surface of the package substrate 111 may have a first anode a1, a second anode a2, a third anode a3, and a first common cathode com1. The first cathode c1 and the second cathode c2 are electrically connected to the first common cathode coral through a TSV. The conductive position 1111 and the conductive vacant position 1112 are provided with and electrically connected to the IC 114 thereon. The IC 114 is provided with and electrically connected to the voltage compensation circuit 113 thereon. The top surface of the voltage compensation circuit 113 has a fourth anode a4 and a fifth anode a5. The light-emitting diode 110 may be respectively arranged on the fourth anode a4 and the first cathode c1 through a first conductive pad 115 and a second conductive pad 116. The light-emitting diode 110 is electrically connected to the fourth anode a4 and the first cathode c1. In other words, the conductive pads of the light-emitting diode 110 are arranged at the same side. In an embodiment of the present invention, the surface of the driving backplane 10 may have a sixth anode a6, a seventh anode a7, an eighth anode a8, and a second common cathode com2. The sixth anode a6 is electrically connected to the first anode a1. The seventh anode a7 is electrically connected to the second anode a2. The eighth anode a8 is electrically connected to the third anode a3. The second common cathode com2 is electrically connected to the first common cathode com1. The driving backplane 10 has a first driver IC 101 and a second driver IC 102. The first driver IC 101 is configured to drive scan lines and the second driver IC 102 is configured to drive data lines, but the present invention is not limited thereto. The first driver IC 101 is electrically connected to the first anode a1, the sixth anode a6, and the IC 114. The first driver IC 101 provides a first driving voltage Vd1 for the IC 114. The second driver IC 102 is electrically connected to the seventh anode a7, the second anode a2, and the IC 114. The second driver IC 102 provides a second driving voltage Vd2 for the IC 114. Since the eighth anode a8 receives a power voltage Vdd, the eighth anode a8 transmits the power voltage Vdd to the IC 114. Since the second common cathode com2 receives the grounding voltage GND, the second common cathode com2 transmits the grounding voltage GND to the light-emitting diode 110 and the IC 114. The IC 114 generates the control voltage Vc in response to the first driving voltage Vd1, the second driving voltage Vd2, and the power voltage Vdd. When the light-emitting diode 110 fails, the light-emitting diode display 1 may further include at least one backup light-emitting diode 112 that is arranged at the conductive vacant position 1112 corresponding to the failed light-emitting diode 110. The driving backplane 10 is electrically connected to the backup light-emitting diode 112 thereon. Specifically, the backup light-emitting diode 112 may be respectively arranged on the fifth anode a5 and the second cathode c2 through a third conductive pad 117 and a fourth conductive pad 118. The backup light-emitting diode 112 is electrically connected to the fifth anode a5 and the second cathode c2. In other words, the conductive pads of the backup light-emitting diode 112 are also arranged at the same side.

Figure 14A:
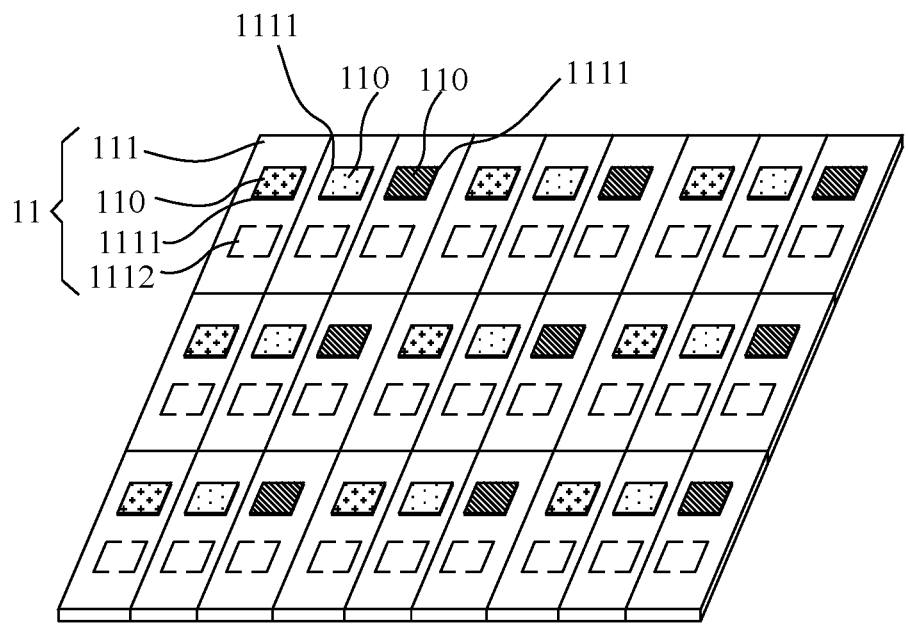
FIGS. 14(a)-14(c) are diagrams schematically illustrating the step of fabricating a LED display according to the first embodiment of the present invention.
Figure 14B:
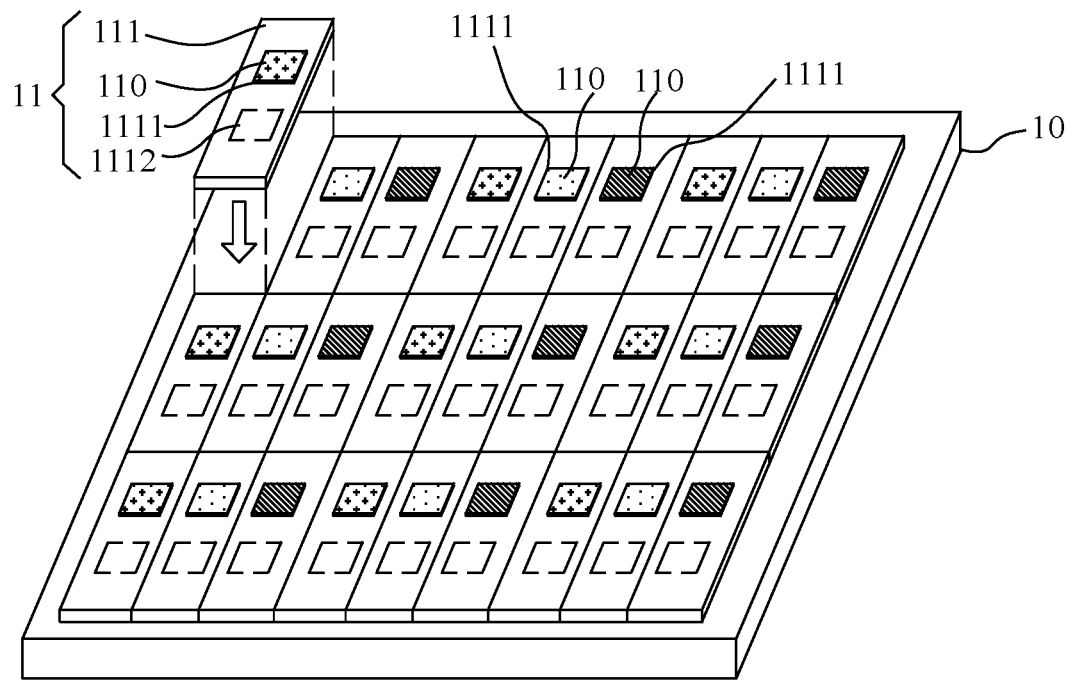
Figure 14C:
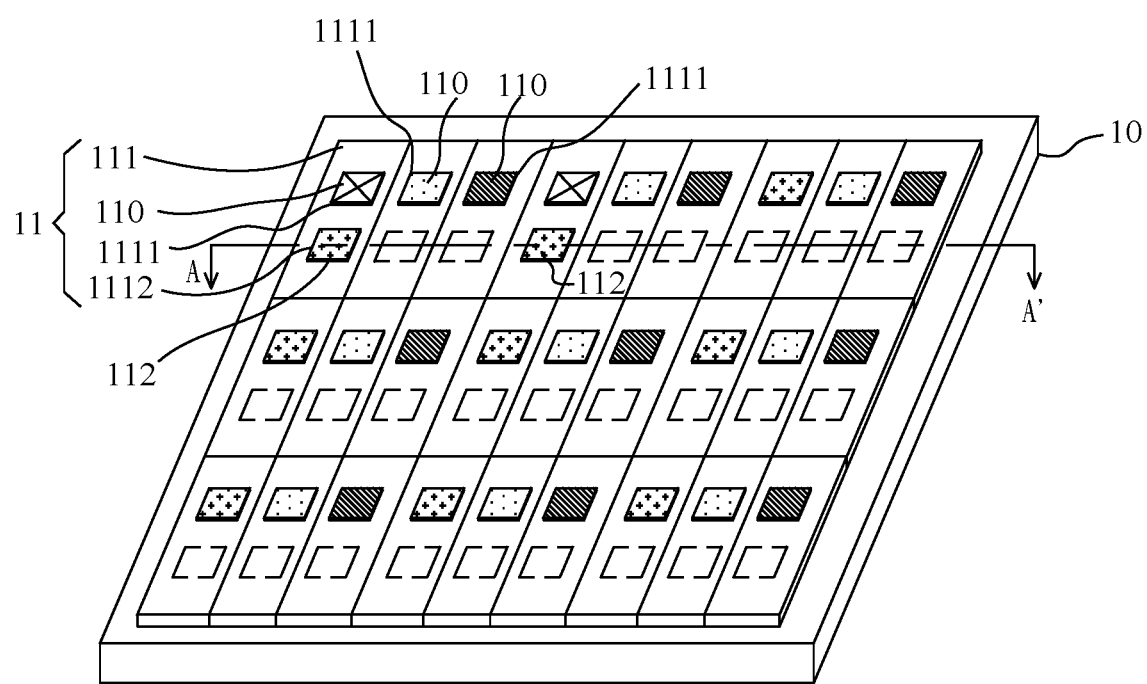

FIGS. 14(*a*)-14(*c*) are diagrams schematically illustrating the step of fabricating a LED display according to the first embodiment of the present invention. Referring to FIGS. 14(*a*)-14(*c*), the method for fabricating the LED display according to the first embodiment of the present invention is introduced as follows. As illustrated in FIG. 14(*a*), a plurality of pixel units 11 is provided. Each pixel unit 11 includes at least one package substrate 111 and at least one light-emitting diode 110. The top surface of the package substrate 111 has at least one conductive position 1111 and at least one conductive vacant position 1112. The conductive vacant position 1112 corresponds to the conductive position 1111. The conductive position 1111 is provided with and electrically connected to the light-emitting diode 110. In the first embodiment, one light-emitting diode 110, one package substrate 111, one conductive position 1111, and one conductive vacant position 1112 of each pixel unit 11 are used. Assume that all the light-emitting diodes 110 and all the package substrates 111 are normal. As illustrated in FIG. 14(*b*), the bottom surfaces of a part of the package substrates 111 are transferred to the driving backplane 10, such that the driving backplane 10 is electrically connected to the light-emitting diodes 110 thereon and the corresponding conductive vacant positions 1112. Alternatively, the bottom surface of the package substrate 111 of each pixel unit 11 is transferred to the driving backplane 10, such that the driving backplane 10 is electrically connected to the conductive vacant position 1112 and the light-emitting diode 110 of each pixel unit 11. If the normality of all the light-emitting diodes 110 and all the package substrates 111 is not determined, a voltage is applied to the package substrates 111 to determine whether the package substrate 111 and the light-emitting diode 110 thereon of each pixel unit 11 are normal after providing all the pixel units 11. If the package substrate 111 and the light-emitting diode 110 thereon of each pixel unit 11 are normal, the bottom surface of the normal package substrate 111 is transferred to the driving backplane 10 and the driving backplane 10 is electrically connected to the light-emitting diode 110 thereon and the corresponding conductive vacant position 1112. If the package substrate 111 and the light-emitting diode 110 thereon of each pixel unit 11 are not normal, the abnormal package substrate 111 separates from the driving backplane 10. Finally, the process determines whether the light-emitting diode 110 electrically connected to the driving backplane 10 emits light. If the light-emitting diode 110 electrically connected to the driving backplane 10 does not emit light, at least one backup light-emitting diode 112 is transferred to the conductive vacant position 1112 and the driving backplane 10 is electrically connected to the backup light-emitting diode 112 thereon, as illustrated in FIG. 14(c). If the light-emitting diode 110 electrically connected to the driving backplane 10 emits light, the process ends.

Figure 15:
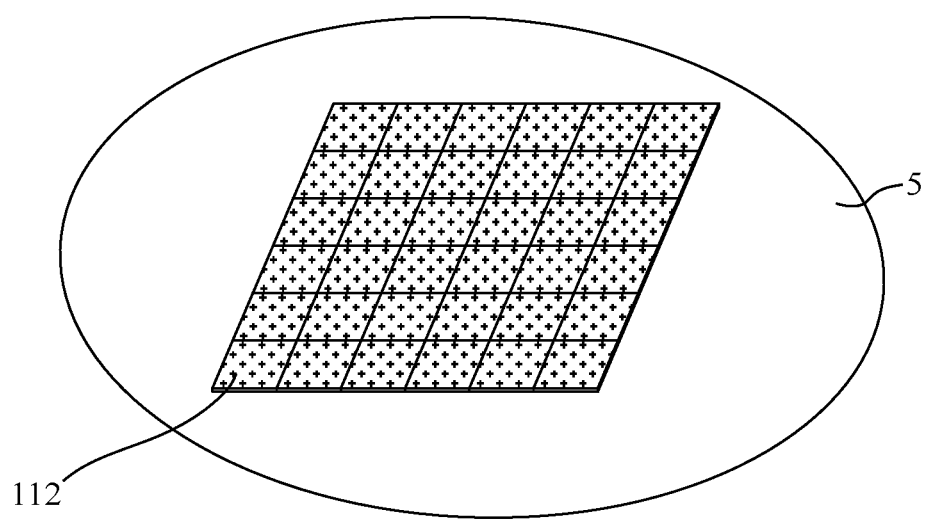
FIG. 15 is a perspective view of a carrier and backup LEDs thereon according to an embodiment of the present invention.
Figure 16A:
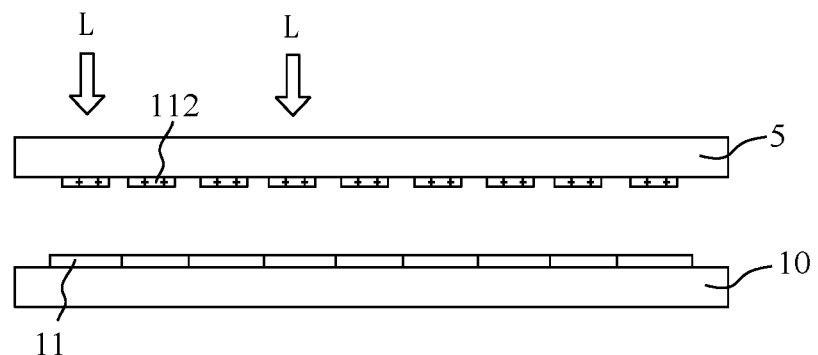
FIGS. 16(a)-16(b) are diagrams schematically illustrating the step of fabricating backup LEDs on the package substrate according to an embodiment of the present invention.
Figure 16B:
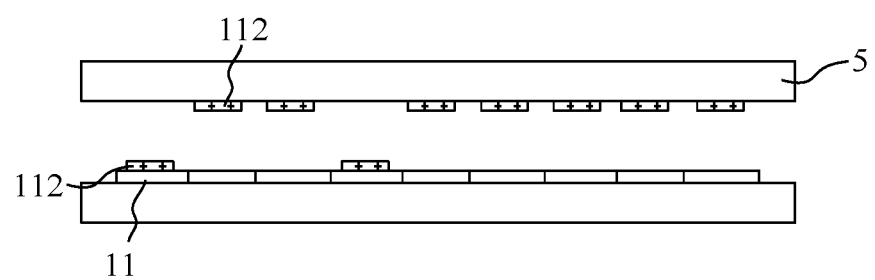

FIG. 15 is a perspective view of a carrier and backup LEDs thereon according to an embodiment of the present invention. FIGS. 16(a)-16(b) are diagrams schematically illustrating the step of fabricating backup LEDs on the package substrate according to an embodiment of the present invention. FIG. 16(b) is a cross-sectional view of the driving backplane 10, the package substrate 11, and the backup light-emitting diode 112 taken along A-A' in FIG. 14(c). Referring to FIG. 14(c), FIG. 15, FIG. 16(a), and FIG. 16(b), a carrier 5 is provided in order to transfer at least one backup light-emitting diode 112 to the conductive vacant position 1112 and electrically connect the driving backplane 10 to the backup light-emitting diode 112 thereon. The carrier 5 is provided with the plurality of backup light-emitting diodes 112 thereon. The arrangement of the backup light-emitting diodes 112 is the same to the arrangement of the conductive positions 1111 and the conductive vacant positions 1112, as illustrated in FIG. 15. If the backup light-emitting diodes 112 are formed at the first column of the second row and the fourth column of the second row of the conductive positions 1111 and the conductive vacant positions 1112, a laser L is irradiated to the backup light-emitting diodes 112 on the carrier 5 according to the positions and the spacing of the backup light-emitting diodes 112. Thus, the backup light-emitting diodes 112 are soldered to the conductive vacant positions 1112.

Figure 17A:
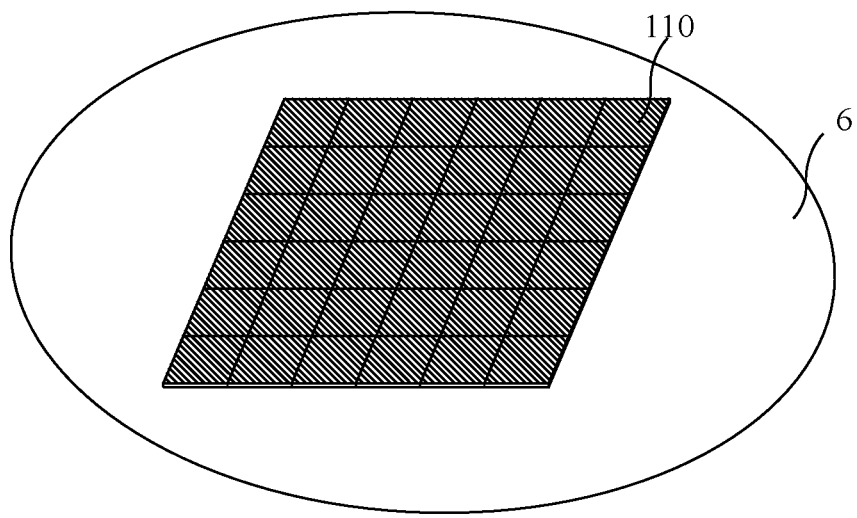
FIGS. 17(a)-17(d) are diagrams schematically illustrating the step of providing pixel units according to an embodiment of the present invention.
Figure 17B:
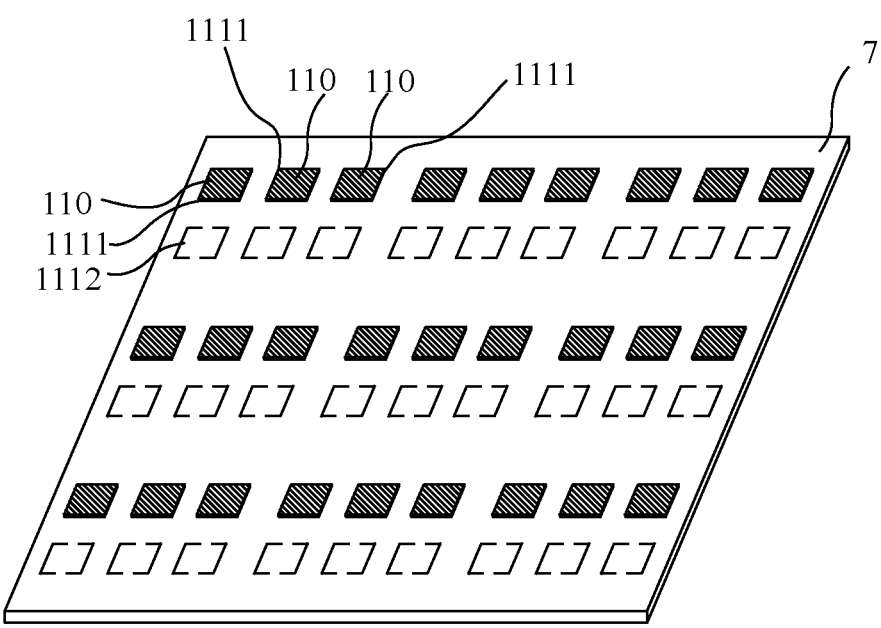
Figure 17C:
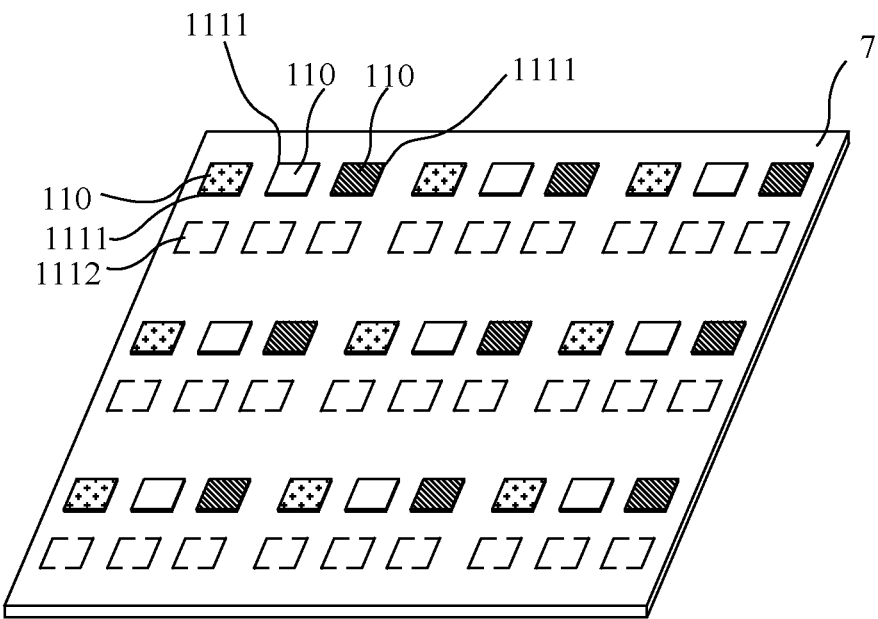
Figure 17D:
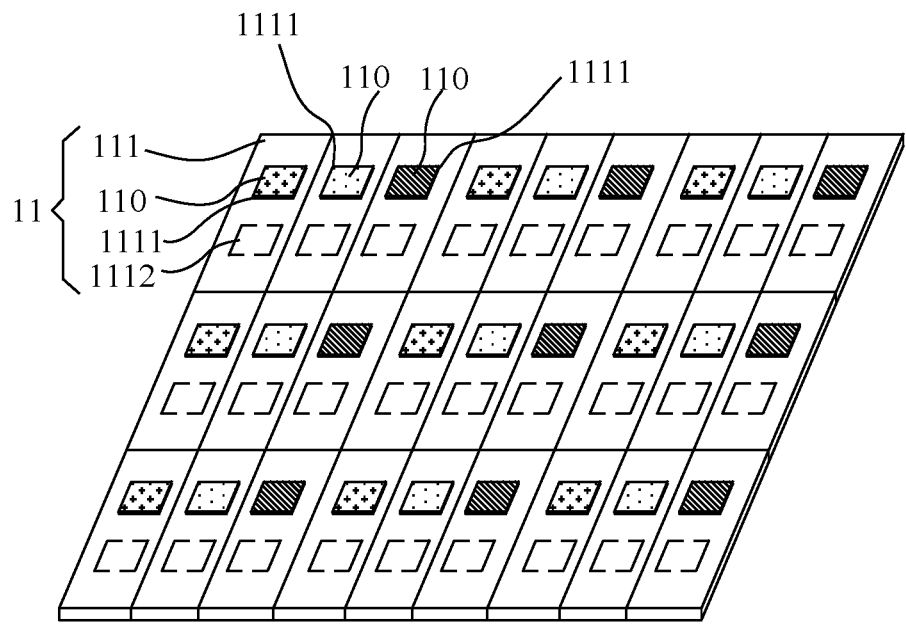

FIGS. 17(a)-17(d) are diagrams schematically illustrating the step of providing pixel units according to an embodiment of the present invention. Referring to FIGS. 17(a)-17(d), the process of providing the pixel units 11 is introduced as follows. As illustrated in FIG. 17(a), a growth substrate 6 equipped with single-color light-emitting diodes 110 is provided. As illustrated in FIG. 17(b), a mother package substrate 7 having the conductive positions 1111 and the conductive vacant positions 1112 is provided. In a wafer-to-wafer way, the light-emitting diodes 110 are transferred to the conductive positions 1111 of the mother package substrate 7. As illustrated in FIG. 17(c), the light-emitting diodes 110 on the mother package substrate 7 are colorized such that the light-emitting diodes 110 on the mother package substrate 7 have different colors. Quantum dots are formed on the light-emitting diodes 110 to colorize the light-emitting diodes 110, but the present invention is not limited thereto. As illustrated in FIG. 17(d), the mother package substrate 7 is divided to form the pixel units 11. Since the growth substrate 6 is used to form single-color LEDs, the times that the conventional technology transfers the light-emitting diodes 110 to the driving backplane 10 are equal to the number of colors of the light-emitting diodes 110. As a result, when the light-emitting diodes 110 having at least three colors are formed in the step of FIG. 17(c), the times of transferring the light-emitting diodes 110 from the growth substrate 6 to the driving backplane 10 is lower than the times that the conventional technology directly transfers different-color light-emitting diodes from different growth substrates to the driving backplane.

Figure 18:
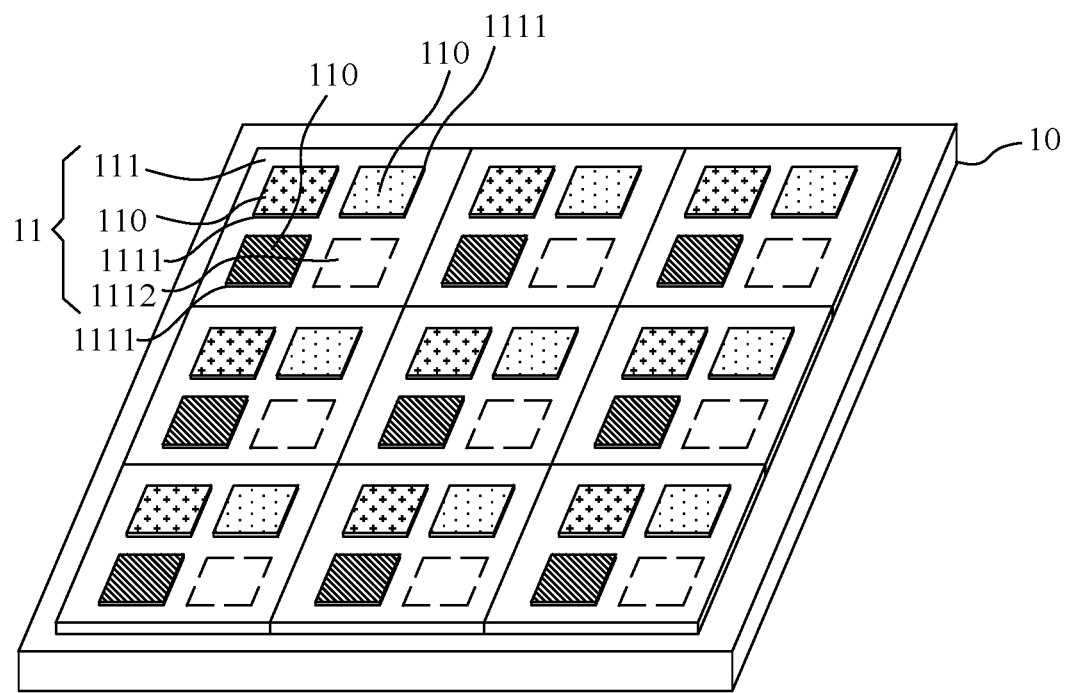
FIG. 18 is a perspective view of a light-emitting diode display according to a second embodiment of the present invention.

FIG. 18 is a perspective view of a light-emitting diode display according to a second embodiment of the present invention. Referring to FIG. 18, the second embodiment is different from the first embodiment in the numbers of the light-emitting diodes 110 and the conductive positions 1111 of the same pixel unit 11. In the second embodiment, there are the plurality of light-emitting diodes 110 and the plurality of conductive positions 1111 of the same pixel unit 11. All the light-emitting diodes 110 are respectively arranged at and electrically connected to all the conductive positions 1111. The number of all the light-emitting diodes 110 is equal to the number of all the conductive positions 1111. The light-emitting diodes 110 include red light-emitting diodes, green light-emitting diodes, and blue light-emitting diodes, but the present invention is not limited thereto.

Figure 19:
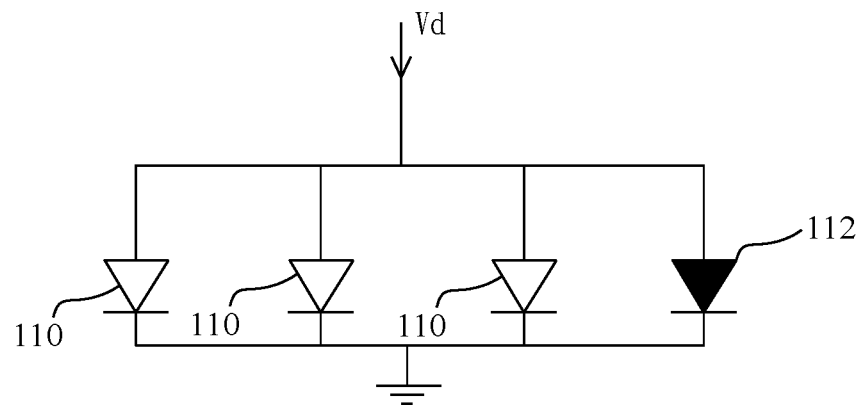
FIG. 19 is a diagram schematically illustrating an equivalent circuit corresponding to FIG. 6 according to the second embodiment of the present invention.

FIG. 19 is a diagram schematically illustrating an equivalent circuit corresponding to FIG. 6 according to the second embodiment of the present invention. Referring to FIG. 2, FIG. 3, FIG. 4, FIG. 5, FIG. 6, and FIG. 19, light-emitting diodes 110, one package substrate 111, conductive positions 1111, and one conductive vacant position 1112 of each pixel unit 11 are used to describe the structure of the light-emitting diode display 1. The structure of the second embodiment is similar to that of the first embodiment. Thus, the difference between the second embodiment and the first embodiment is introduced as follows. In the second embodiment, each conductive position 1111 may have a first anode A1 and a first cathode C1. All the first anodes A1 are respectively electrically connected to all the third anodes A3. All the first cathodes C1 and the second cathode C2 are electrically connected to the first common cathode COM1. All the third anodes A3 are respectively electrically connected to all the fifth anodes A5. The driver IC 100 is electrically connected to all the first anodes A1, the second anode A2, all the third anodes A3, the fourth anode A4, all the fifth anodes A5, the sixth anode A6, and all the light-emitting diodes 110. The driver IC 100 provides the driving voltage Vd for all the light-emitting diodes 110 and the second anode A2.

Figure 20:
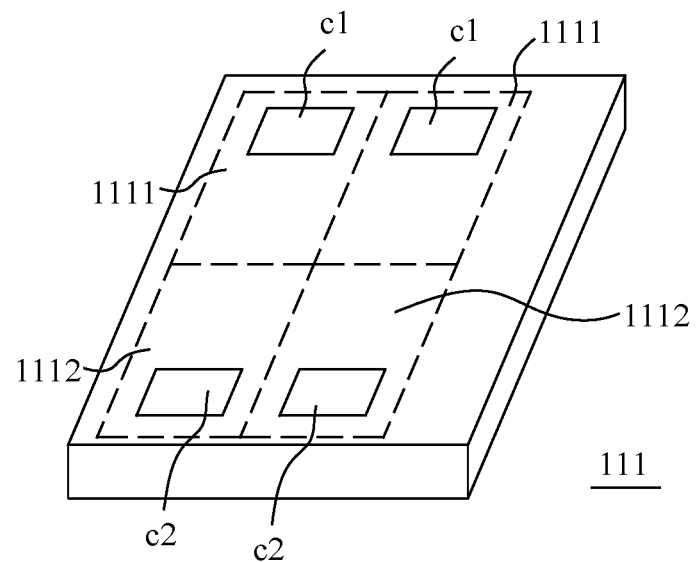
FIG. 20 is a diagram schematically illustrating the top surface of a package substrate according to further embodiment of the present invention.
Figure 21:
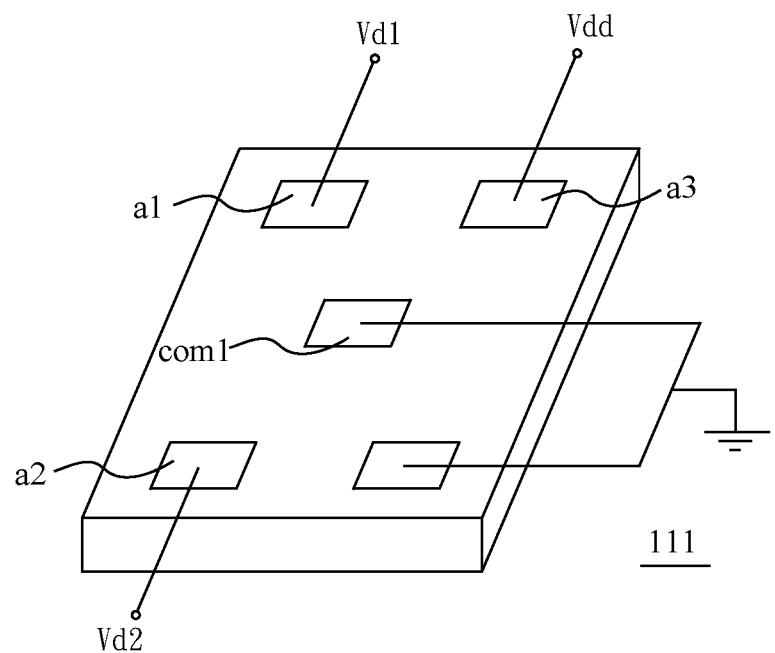
FIG. 21 is a diagram schematically illustrating the bottom surface of a package substrate according to further embodiment of the present invention.
Figure 22:
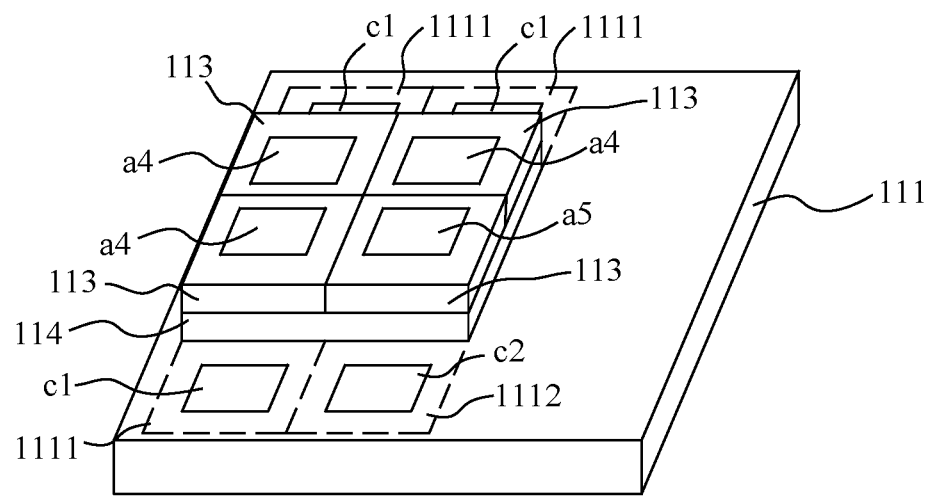
FIG. 22 is a perspective view of an IC and a voltage compensation circuit on the package backplane according to another embodiment of the present invention.
Figure 23:
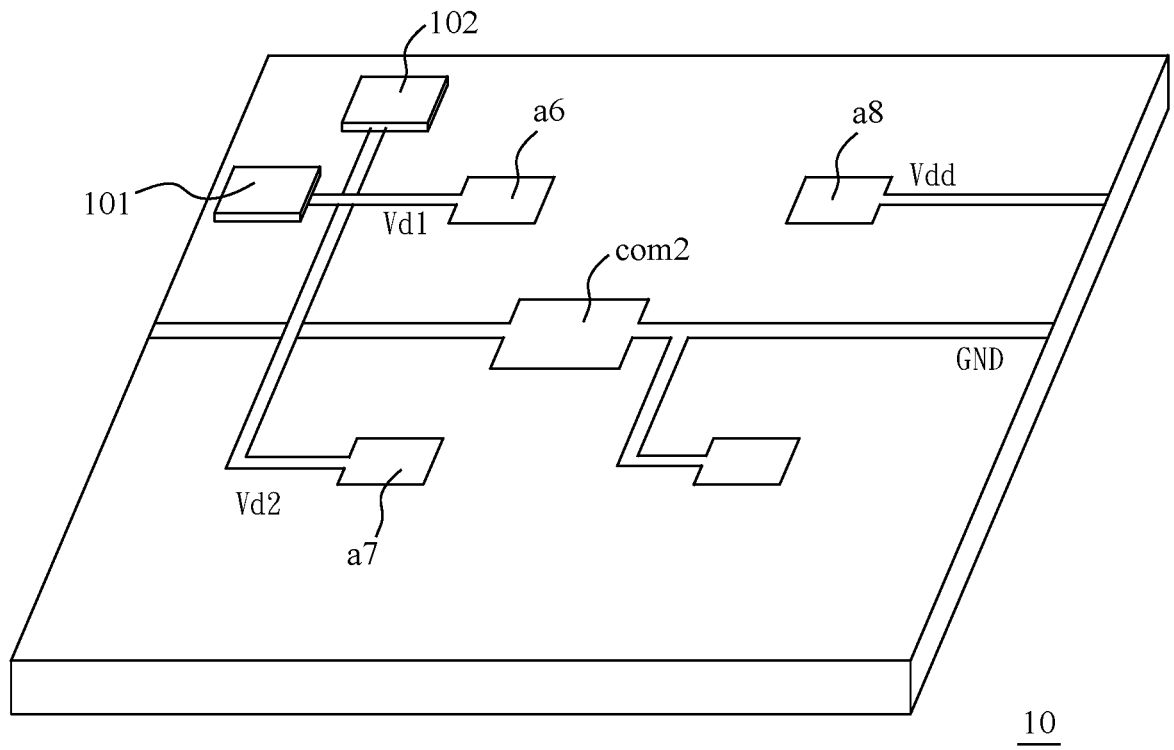
FIG. 23 is a perspective view of a driving backplane according to further embodiment of the present invention.
Figure 24:
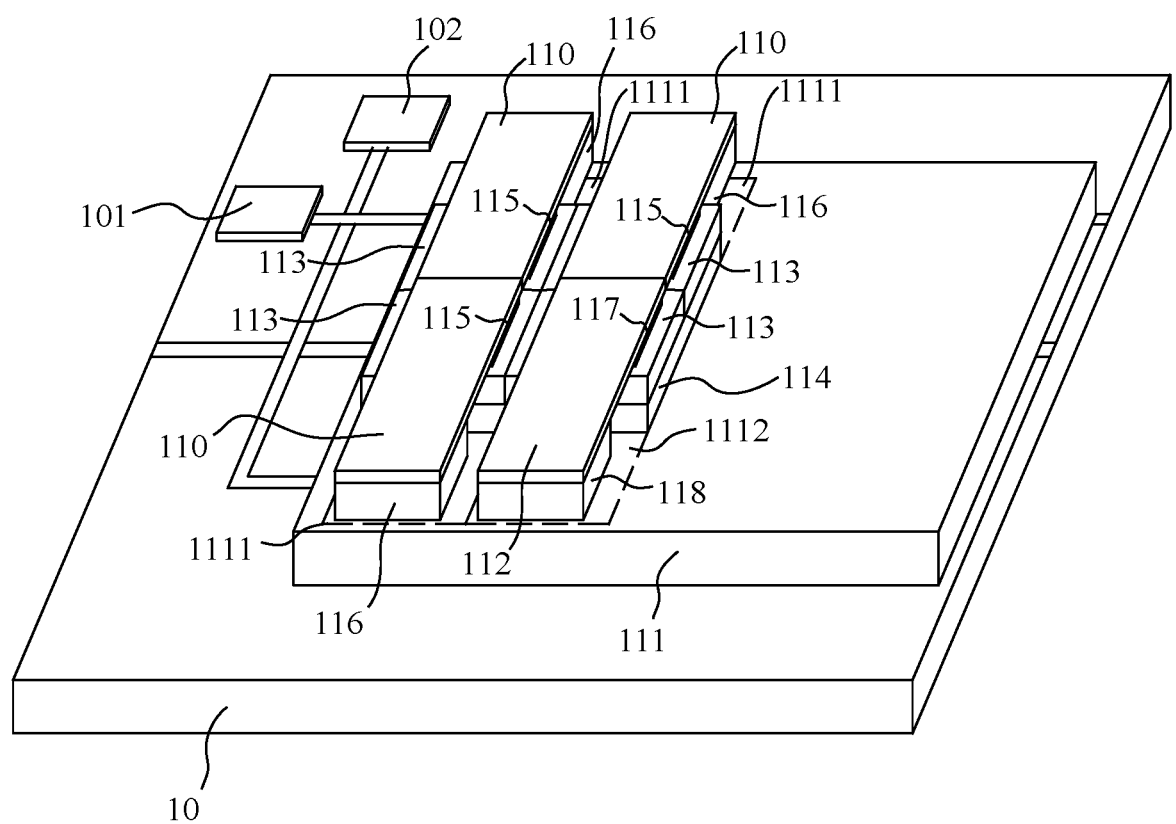
FIG. 24 is a perspective view of a LED, a backup LED, an IC, a voltage compensation circuit, and a package substrate on the driving backplane according to another embodiment of the present invention.
Figure 25:
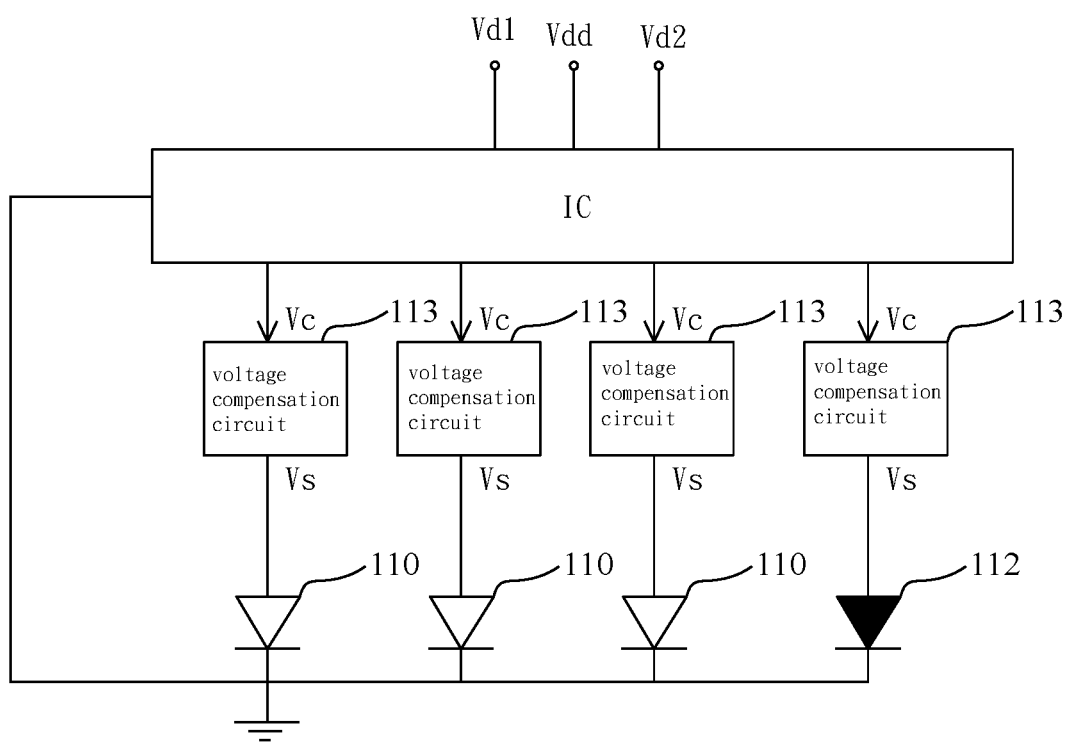
FIG. 25 is a diagram schematically illustrating an equivalent circuit corresponding to FIG. 24 according to the second embodiment of the present invention.

FIG. 20 is a diagram schematically illustrating the top surface of a package substrate according to further embodiment of the present invention. FIG. 21 is a diagram schematically illustrating the bottom surface of a package substrate according to further embodiment of the present invention. FIG. 22 is a perspective view of an IC and a voltage compensation circuit on the package backplane according to another embodiment of the present invention. FIG. 23 is a perspective view of a driving backplane according to further embodiment of the present invention. FIG. 24 is a perspective view of a LED, a backup LED, an IC, a voltage compensation circuit, and a package substrate on the driving backplane according to another embodiment of the present invention. FIG. 25 is a diagram schematically illustrating an equivalent circuit corresponding to FIG. 24 according to the second embodiment of the present invention. Referring to FIG. 20, FIG. 21, FIG. 22, FIG. 23, FIG. 24, and FIG. 25, light-emitting diodes 110, one package substrate 111, conductive positions 1111, and one conductive vacant position 1112 of each pixel unit 11 are used to describe the structure of the light-emitting diode display 1. In another embodiment of the present invention, each pixel unit 11 further includes voltage compensation circuits 113 and an IC 114. In the second embodiment, the total number of the conductive positions 1111 and the conductive vacant position 1112 of each pixel unit 11 is equal to the number of the voltage compensation circuits 113 of the pixel unit 11 are equal. The IC 114 is arranged between the package substrate 111 and the voltage compensation circuits 113. The IC 114 is arranged on the conductive positions 1111 and the corresponding conductive vacant position 1112. One of the voltage compensation circuits 113 is arranged on the IC 114 and directly arranged over the conductive vacant position 1112. The remains of the voltage compensation circuits 113 are arranged between the IC 114 and the light-emitting diodes 110 and respectively directly arranged over the conductive positions 1111. The light-emitting diodes 110 are respectively electrically connected to the conductive positions 1111 through the IC 114 and the voltage compensation circuits 113. The voltage compensation circuit 113 is electrically connected to the corresponding conductive vacant position 1112 through the IC 114. The IC 114 is configured to generate control voltages Vc. The voltage compensation circuits 113 are configured to receive the control voltages Vc and perform voltage compensation on the control voltages Vc to generate display voltages Vs. The voltage compensation circuits 113 transmit the display voltages Vs to the light-emitting diodes 110. For example, the number of the control voltages Vc of each pixel unit 11 is equal to the number of the display voltages Vs of each pixel unit 11 and equal to the conductive positions 1111 and the conductive vacant position 1112 of each pixel unit 11.

Specifically, the conductive position 1111 may have a first cathode c1 and the conductive vacant position 1112 may have a second cathode c2. The bottom surface of the package substrate 111 may have a first anode a1, a second anode a2, a third anode a3, and a first common cathode com1. The first cathode c1 and the second cathode c2 are electrically connected to the first common cathode com1 through a TSV. The conductive positions 1111 and the conductive vacant position 1112 are provided with and electrically connected to the IC 114 thereon. The IC 114 is provided with and electrically connected to the voltage compensation circuits 113 thereon. The top surface of the voltage compensation circuit 113 has a fourth anode a4 and a fifth anode a5. The light-emitting diode 110 may be respectively arranged on the fourth anode a4 and the first cathode c1 through a first conductive pad 115 and a second conductive pad 116. The light-emitting diode 110 is electrically connected to the fourth anode a4 and the first cathode c1. In other words, the conductive pads of the light-emitting diode 110 are arranged at the same side. In an embodiment of the present invention, the surface of the driving backplane 10 may have a sixth anode a6, a seventh anode a7, an eighth anode a8, and a second common cathode com2. The sixth anode a6 is electrically connected to the first anode a1. The seventh anode a7 is electrically connected to the second anode a2. The eighth anode a8 is electrically connected to the third anode a3. The second common cathode com2 is electrically connected to the first common cathode com1. The driving backplane 10 has a first driver IC 101 and a second driver IC 102. The first driver IC 101 is electrically connected to the first anode a1, the sixth anode a6, and the IC 114. The first driver IC 101 provides a first driving voltage Vd1 for the IC 114. The second driver IC 102 is electrically connected to the seventh anode a7, the second anode a2, and the IC 114. The second driver IC 102 provides a second driving voltage Vd2 for the IC 114. Since the eighth anode a8 receives a power voltage Vdd, the eighth anode a8 transmits the power voltage Vdd to the IC 114. Since the second common cathode com2 receives the grounding voltage GND, the second common cathode com2 transmits the grounding voltage GND to the light-emitting diodes 110 and the IC 114. The IC 114 generates the control voltages Vc in response to the first driving voltage Vd1, the second driving voltage Vd2, and the power voltage Vdd. When the light-emitting diode 110 fails, the light-emitting diode display 1 may further include at least one backup light-emitting diode 112 that is arranged at the conductive vacant position 1112 corresponding to the failed light-emitting diode 110. The driving backplane 10 is electrically connected to the backup light-emitting diode 112 thereon. Specifically, the backup light-emitting diode 112 may be respectively arranged on the fifth anode a5 and the second cathode c2 through a third conductive pad 117 and a fourth conductive pad 118. The backup light-emitting diode 112 is electrically connected to the fifth anode a5 and the second cathode c2. In other words, the conductive pads of the backup light-emitting diode 112 are also arranged at the same side. According to the control voltage Vc corresponding to the failed light-emitting diode 110, the IC 114 may provide the precise control voltage Vc for the backup light-emitting diode 112 and the corresponding voltage compensation circuit 113, thereby decreasing the area occupied by the conductive vacant position 1112.

The method for fabricating the LED display according to the second embodiment of the present invention is introduced as follows. The method for fabricating the LED display of the second embodiment of the present invention is different from the method for fabricating the LED display of the first embodiment of the present invention in the structure of the pixel unit 11. The remaining features of the method of the second embodiment are the same to those of the first embodiment so will not be reiterated. Since each package substrate 111 of the second embodiment is provided with the light-emitting diodes 110, the times of transferring the light-emitting diodes 110 are decreased and the successful rate of transferring the light-emitting diodes 110 is increased.

Figure 26:
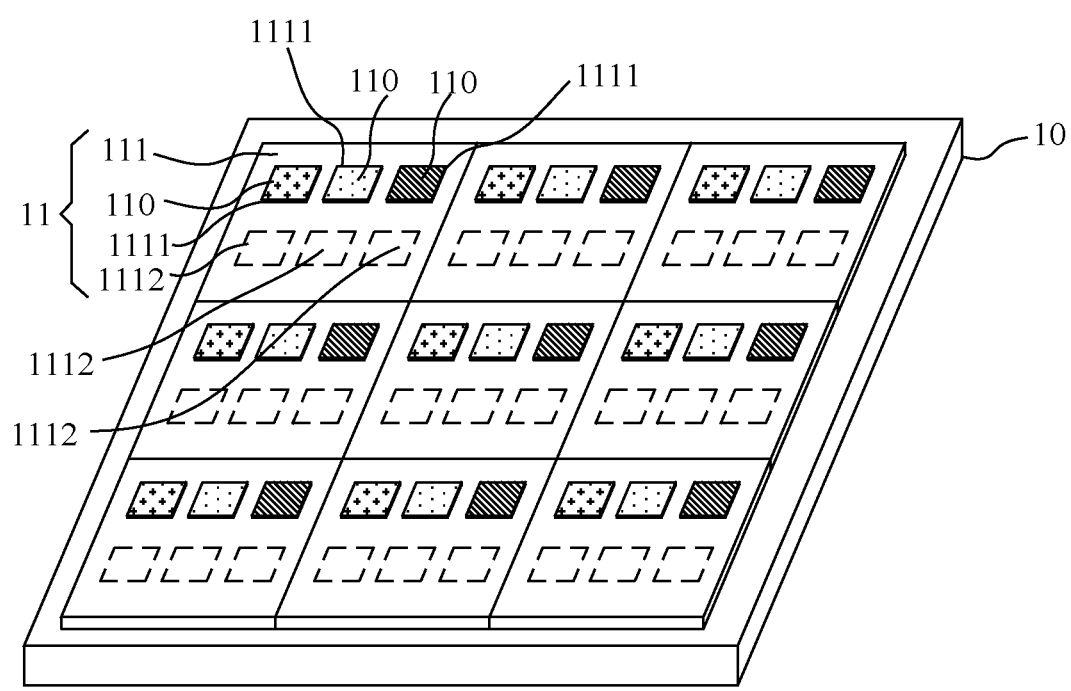
FIG. 26 is a perspective view of a light-emitting diode display according to a third embodiment of the present invention.

FIG. 26 is a perspective view of a light-emitting diode display according to a third embodiment of the present invention. Referring to FIG. 26, the light-emitting diode display 1 according to the third embodiment of the present invention is introduced as follows. The third embodiment is different from the first embodiment in the numbers of the conductive positions 1111, the conductive vacant positions 1112, and the corresponding components. In the third embodiment, there are conductive positions 1111, conductive vacant positions 1112, and light-emitting diodes 110. The light-emitting diodes 110 are respectively arranged at and electrically connected to the conductive positions 1111. The number of the light-emitting diodes 110 is equal to the number of the conductive positions 1111. The light-emitting diodes 110 include red light-emitting diodes, green light-emitting diodes, and blue light-emitting diodes. The conductive vacant positions 1112 respectively correspond to the conductive positions 1111. The number of the conductive vacant positions 1112 is equal to the number of the conductive positions 1111.

Figure 27:
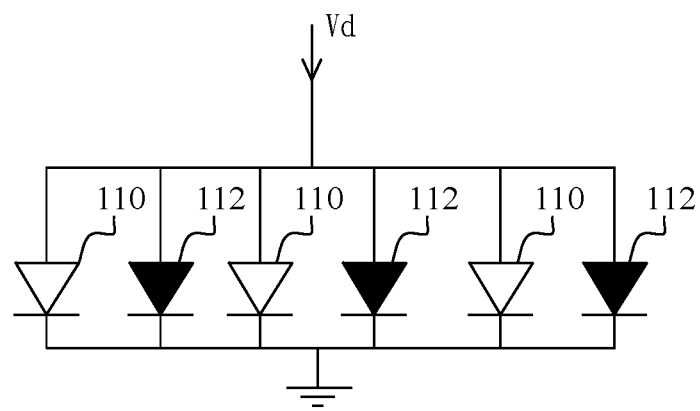
FIG. 27 is a diagram schematically illustrating an equivalent circuit corresponding to FIG. 6 according to the third embodiment of the present invention.

FIG. 27 is a diagram schematically illustrating an equivalent circuit corresponding to FIG. 6 according to the third embodiment of the present invention. Referring to FIG. 2, FIG. 3, FIG. 4, FIG. 5, FIG. 6, and FIG. 27, light-emitting diodes 110, one package substrate 111, conductive positions 1111, and conductive vacant positions 1112 of each pixel unit 11 are used to describe the structure of the light-emitting diode display 1. However, the connecting and structural relations of the components of the third embodiment are the same to those of the components of the first embodiment so will not be reiterated.

Figure 28:
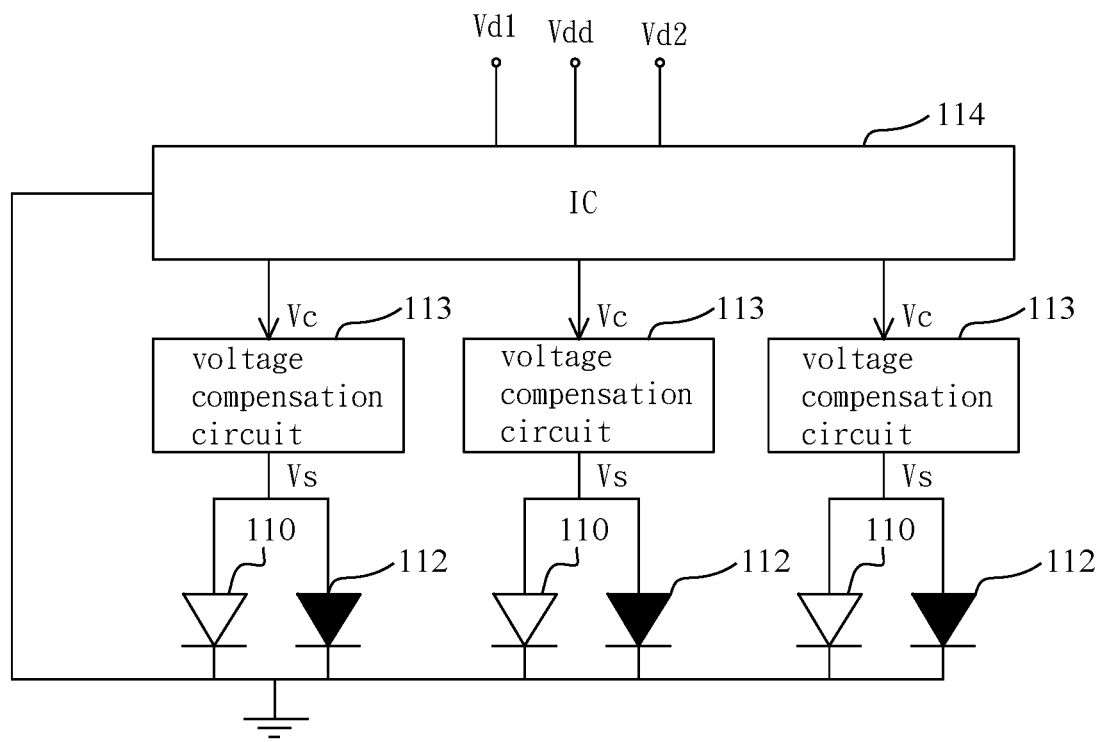
FIG. 28 is a diagram schematically illustrating an equivalent circuit corresponding to FIG. 12 according to the third embodiment of the present invention.

FIG. 28 is a diagram schematically illustrating an equivalent circuit corresponding to FIG. 12 according to the third embodiment of the present invention. Referring to FIG. 8, FIG. 9, FIG. 10, FIG. 11, FIG. 12, and FIG. 28, light-emitting diodes 110, one package substrate 111, voltage compensation circuits 113, conductive positions 1111, and conductive vacant positions 1112 of each pixel unit 11 are used to describe the structure of the light-emitting diode display 1. However, the connecting and structural relations of the components of the third embodiment are the same to those of the components of the first embodiment so will not be reiterated.

The method for fabricating the LED display according to the third embodiment of the present invention is introduced as follows. The method for fabricating the LED display of the third embodiment of the present invention is different from the method for fabricating the LED display of the first embodiment of the present invention in the structure of the pixel unit 11. The remaining features of the method of the second embodiment are the same to those of the first embodiment so will not be reiterated. Since each package substrate 111 of the third embodiment is provided with the light-emitting diodes 110, the times of transferring the light-emitting diodes 110 are decreased and the successful rate of transferring the light-emitting diodes 110 is increased.

Figure 29:
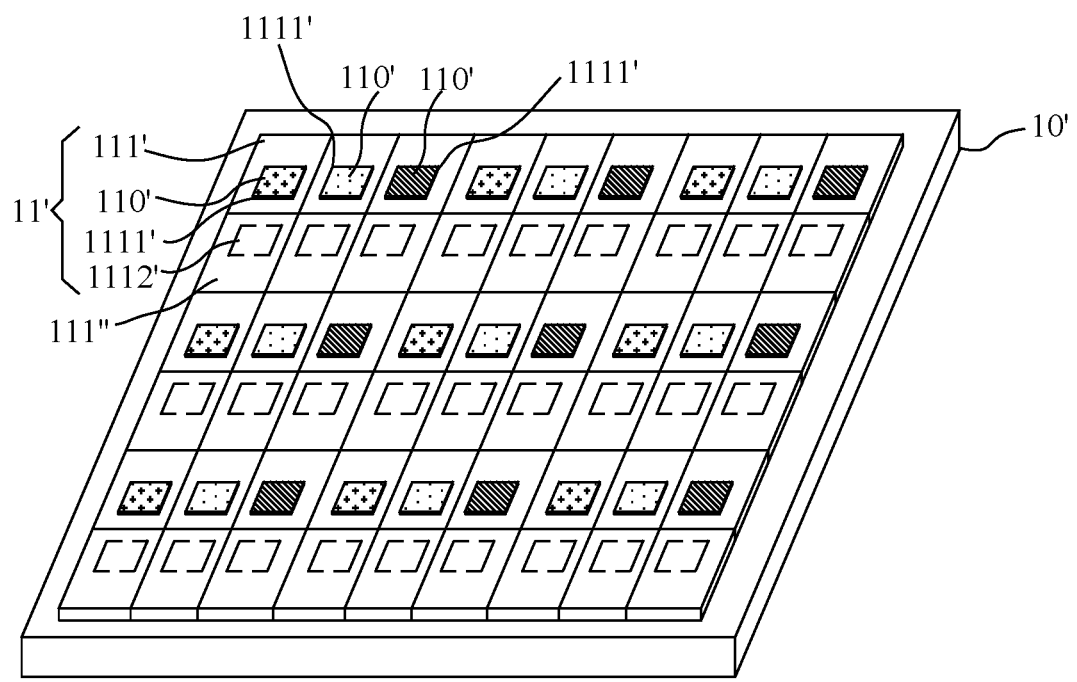
FIG. 29 is a perspective view of a light-emitting diode display according to a fourth embodiment of the present invention.

FIG. 29 is a perspective view of a light-emitting diode display according to a fourth embodiment of the present invention. Referring to FIG. 29, the light-emitting diode display 1' according to the fourth embodiment of the present invention is introduced as follows. The light-emitting diode display 1' includes a driving backplane 10' and a plurality of pixel units 11'. Each pixel unit 11' includes at least one light-emitting diode (LED) 110', a first package substrate 111', and a second package substrate 111". The light-emitting diode 110' includes, but not limited to, a red light-emitting diode, a green light-emitting diode, or a blue light-emitting diode. Besides, the size of the light-emitting diode 110' is not limited. The light-emitting diode 110' may be a mini light-emitting diode or a micro light-emitting diode. As illustrated in FIG. 29, the light-emitting diodes 110' have different cross-section lines that respectively represent different-color light-emitting diodes. The top surface of the first package substrate 111' has at least one conductive position 1111'. The top surface of the second package substrate 111" has at least one conductive vacant position 1112'. In the fourth embodiment, one light-emitting diode 110', one conductive position 1111', and one conductive vacant position 1112' of each pixel unit 11' are used, but the present invention is not limited thereto. The conductive position 1111' is provided with the light-emitting diode 110' thereon. The conductive position 1111' is electrically connected to the light-emitting diode 110' thereon. The bottom surfaces of the first package substrate 111' and the second package substrate 111" of each pixel unit 11' are arranged on the driving backplane 10'. The driving backplane 10' is electrically connected to the light-emitting diode 110' and the corresponding conductive vacant position 1112' of each pixel unit 11' thereon. In the present invention, the first package substrate 111' is arranged between the driving backplane 10' and the light-emitting diode 110'. Thus, the circuit of the driving backplane 10' is transferred to the first package substrate 111' to decrease the complexity of circuits of the driving backplane 10'. As a result, the light-emitting diodes 110' can be closely arranged to increase the utilization of light emitting areas. Accordingly, the light-emitting diode display 1' has applications of high-resolution products.

Figure 30:
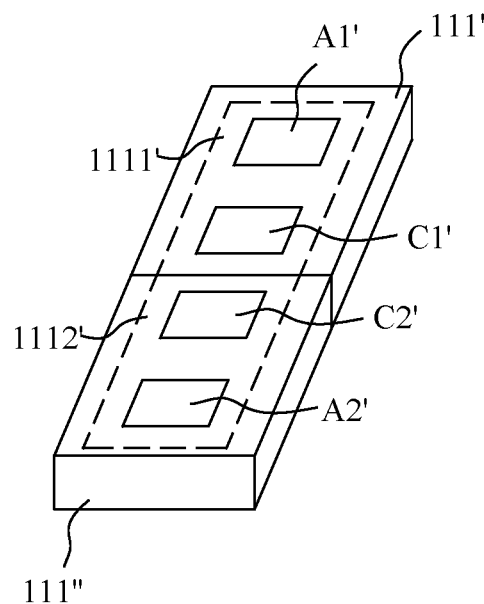
FIG. 30 is a diagram schematically illustrating the top surfaces of a first package substrate and a second package substrate according to an embodiment of the present invention.
Figure 31:
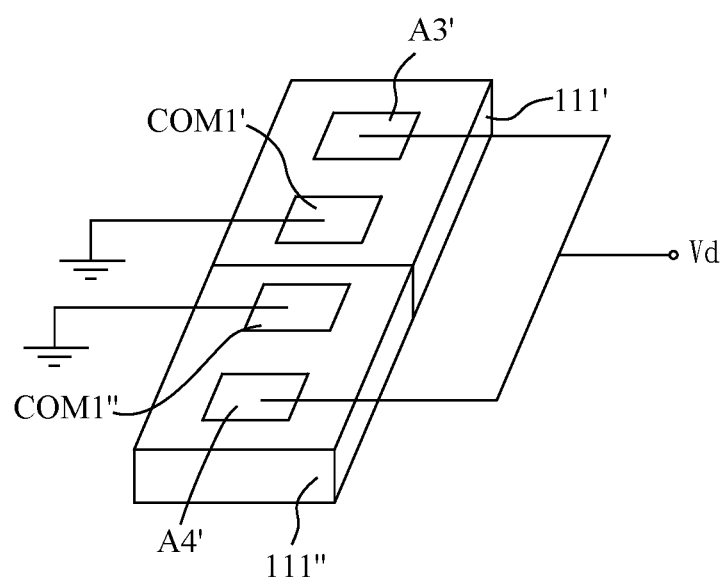
FIG. 31 is a diagram schematically illustrating the bottom surfaces of a first package substrate and a second package substrate according to an embodiment of the present invention.
Figure 32:
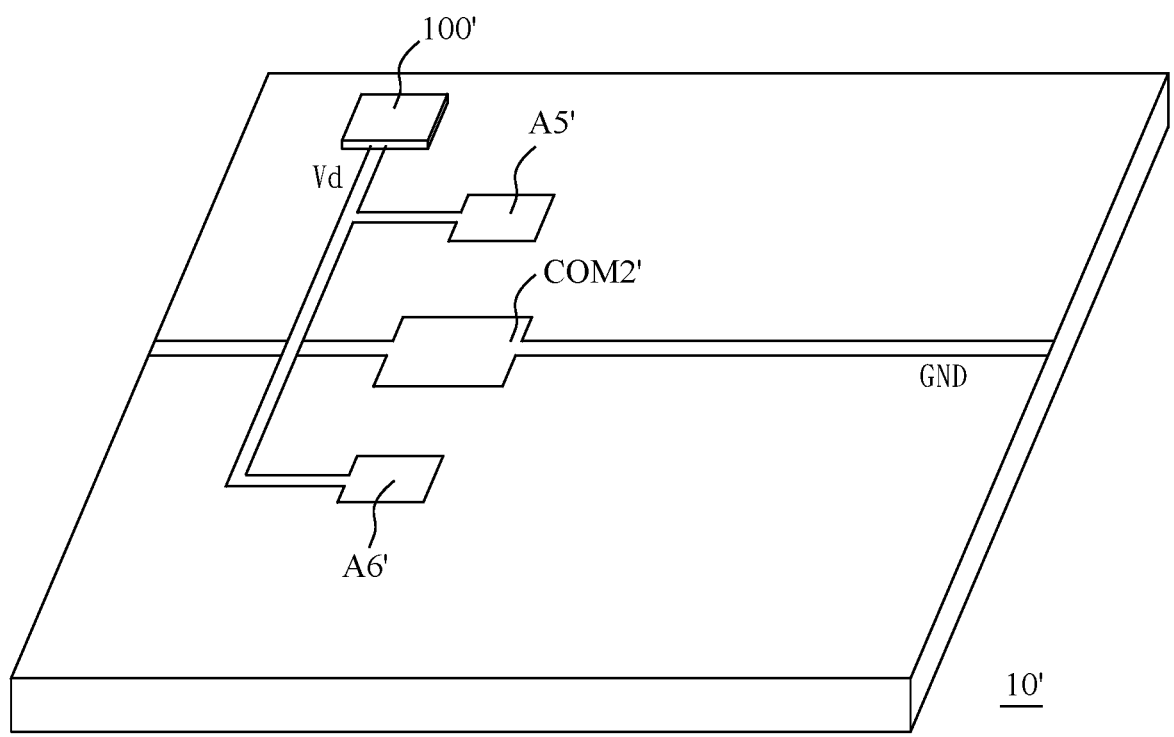
FIG. 32 is a perspective view of a driving backplane according to an embodiment of the present invention.
Figure 33:
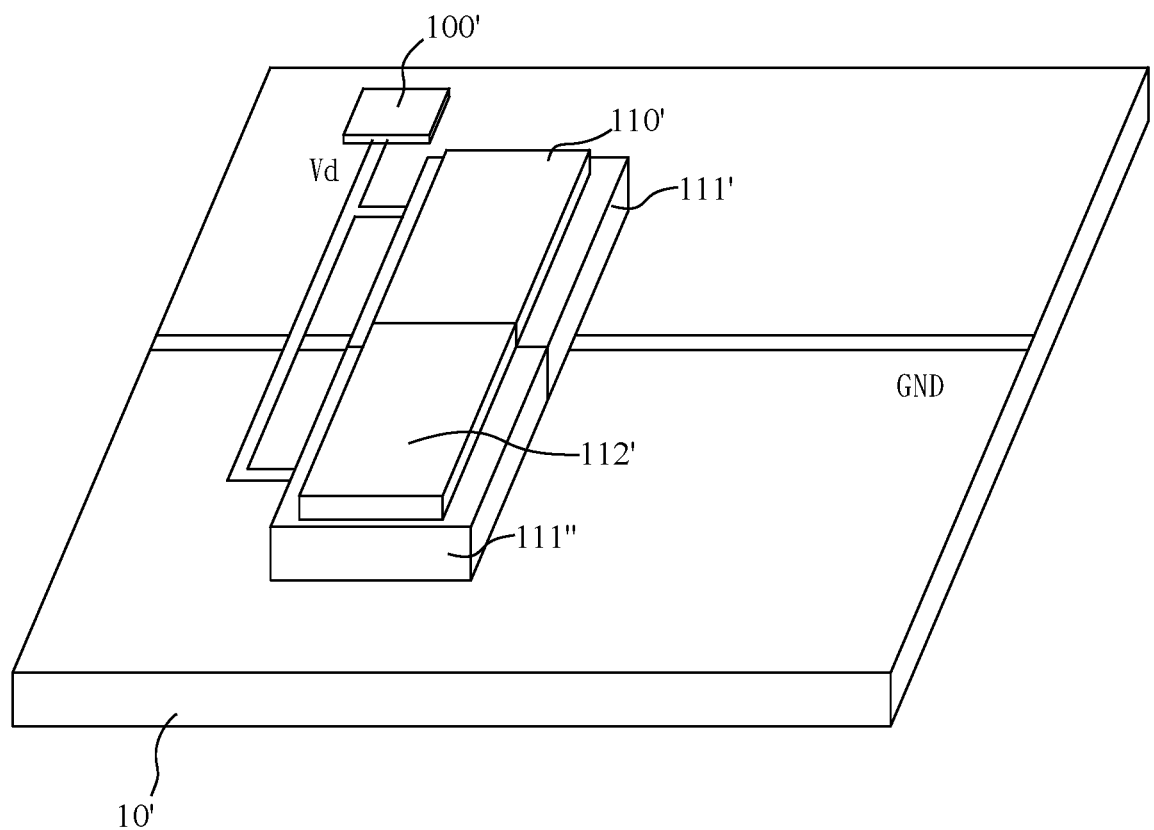
FIG. 33 is a perspective view of a LED, a backup LED, an IC, a first package substrate, and a second package substrate on the driving backplane according to an embodiment of the present invention.
Figure 34:
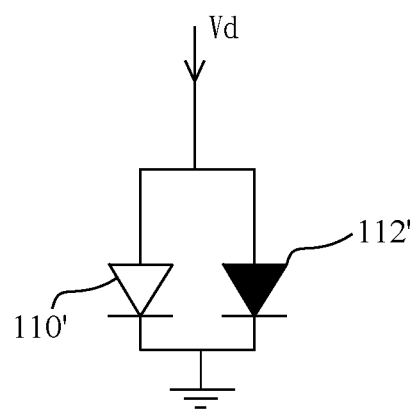
FIG. 34 is a diagram schematically illustrating an equivalent circuit corresponding to FIG. 33 according to the fourth embodiment of the present invention.

FIG. 30 is a diagram schematically illustrating the top surfaces of a first package substrate and a second package substrate according to an embodiment of the present invention. FIG. 31 is a diagram schematically illustrating the bottom surfaces of a first package substrate and a second package substrate according to an embodiment of the present invention. FIG. 32 is a perspective view of a driving backplane according to an embodiment of the present invention. FIG. 33 is a perspective view of a LED, a backup LED, an IC, a first package substrate, and a second package substrate on the driving backplane according to an embodiment of the present invention. FIG. 34 is a diagram schematically illustrating an equivalent circuit corresponding to FIG. 33 according to the fourth embodiment of the present invention. Referring to FIG. 30, FIG. 31, FIG. 32, FIG. 33, and FIG. 34, one light-emitting diode 110', one conductive position 1111', and one conductive vacant position 1112' of each pixel unit 11' are used to describe the structure of the light-emitting diode display 1'. In an embodiment of the present invention, the conductive position 1111' may have a first anode A1' and a first cathode C1'. The conductive vacant position 1112' may have a second anode A2' and a second cathode C2'. The bottom surface of the first package substrate 111' may have at least one third anode A3' and a first common cathode COM1'. The bottom surface of the second package substrate 111" may have at least one fourth anode A4' and a second common cathode COM1". The number of the third anode A3' is equal to the number of the conductive position 1111'. The number of the fourth anode A4' is equal to the number of the conductive vacant position 1112'. The first anode A1' is electrically connected to the third anode A3'. The second anode A2' is electrically connected to the fourth anode A4'. The first cathode C1' is electrically connected to the first common cathode COM1'. The second cathode C2" is electrically connected to the second common cathode COM1". The first anode A1' and the first cathode C1' are provided with and electrically connected to the light-emitting diode 110' thereon. In other words, the conductive pads of the light-emitting diode 110' are arranged at the same side. The above-mentioned electrodes are electrically connected to each other using the through silicon via (TSV) technology. In an embodiment of the present invention, the surface of the driving backplane 10' may have at least one fifth anode A5', at least one sixth anode A6', and a second common cathode COM2'. The number of the fifth anode A5' is equal to the number of the conductive position 1111'. The number of the sixth anode A6' is equal to the number of the conductive vacant position 1112'. The fifth anode A5' is electrically connected to the sixth anode A6'. The third anode A3' is electrically connected to the fifth anode A5'. The fourth anode A4' is electrically connected to the sixth anode A6'. The first common cathode COM1', the second common cathode COM1", and the third common cathode COM2' are electrically connected to each other. Thus, the driving backplane 10' is electrically connected to the light-emitting diodes 110' thereon and the corresponding conductive vacant positions 1112'. The driving backplane 10' includes a driver integrated circuit (IC) 100'. The driver IC 100' is electrically connected to the first anode A1', the second anode A2', the third anode A3', the fourth anode A4', the fifth anode A5', the sixth anode A6', and the light-emitting diode 110'. The driver IC 100' provides a driving voltage Vd for the light-emitting diode 110' and the second anode A2'. Since the third common cathode COM2' receives a grounding voltage GND, the third common cathode COM2' transmits the grounding voltage GND to the light-emitting diode 110' and the second cathode C2'. When the light-emitting diode 110' fails, the light-emitting diode display 1' may further include at least one backup light-emitting diode 112' that is arranged at the conductive vacant position 1112' corresponding to the failed light-emitting diode 110'. The driving backplane 10' is electrically connected to the backup light-emitting diode 112' thereon. Specifically, the backup light-emitting diode 112' is arranged on and electrically connected to the second anode A2' and the second cathode C2'. The backup light-emitting diode 112' receives the driving voltage Vd and the grounding voltage GND. As a result, the conductive pads of the backup light-emitting diode 112' are also arranged at the same side.

Figure 35:
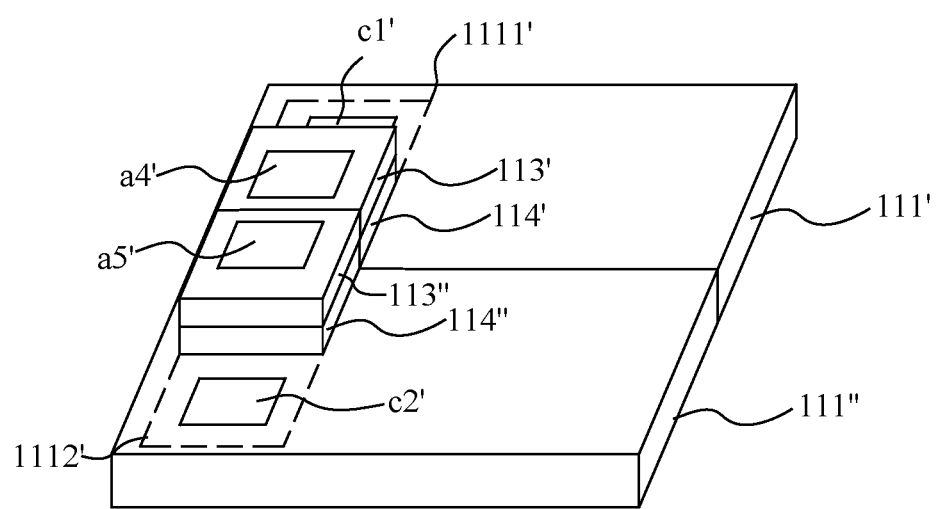
FIG. 35 is a perspective view of a first IC, a second IC, a first voltage compensation circuit, and a second voltage compensation circuit on a first package substrate and a second package substrate according to an embodiment of the present invention.
Figure 36:
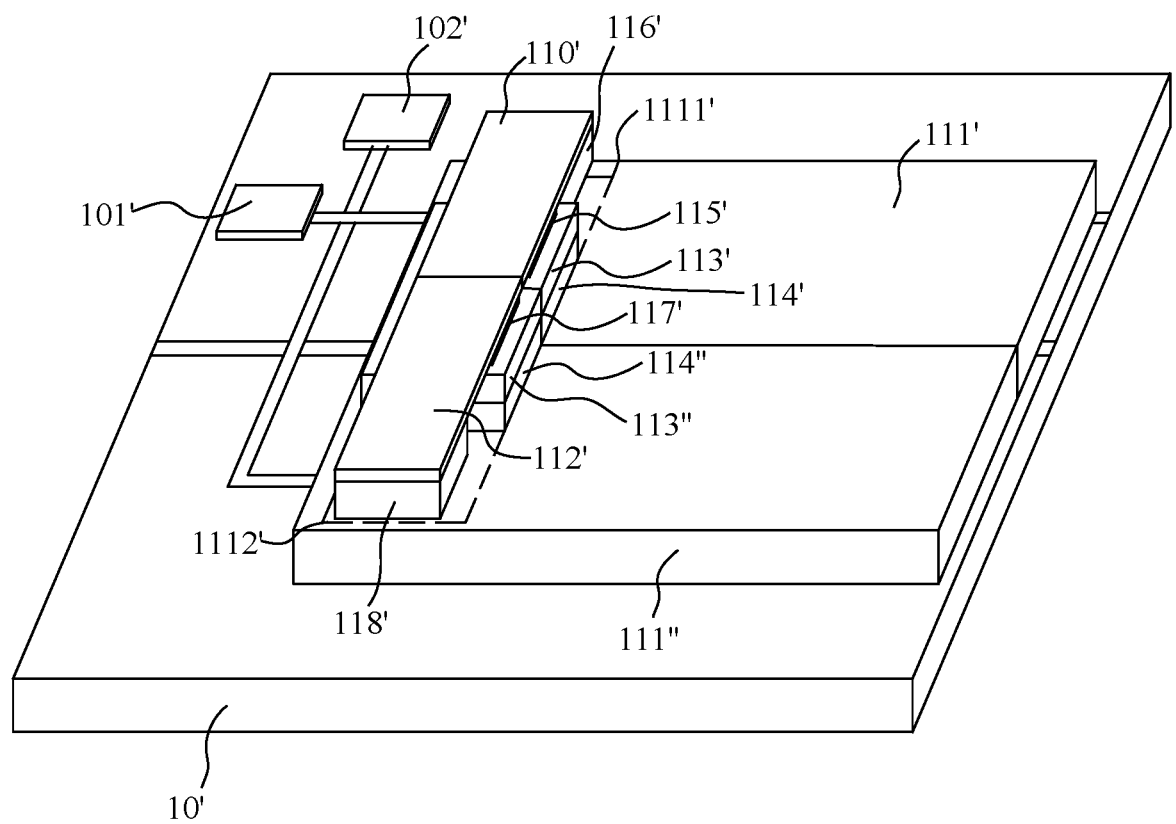
FIG. 36 is a perspective view of a LED, a backup LED, a first IC, a second IC, a first voltage compensation circuit, a second voltage compensation circuit, a first package substrate, and a second package substrate on the driving backplane according to an embodiment of the present invention.
Figure 37:
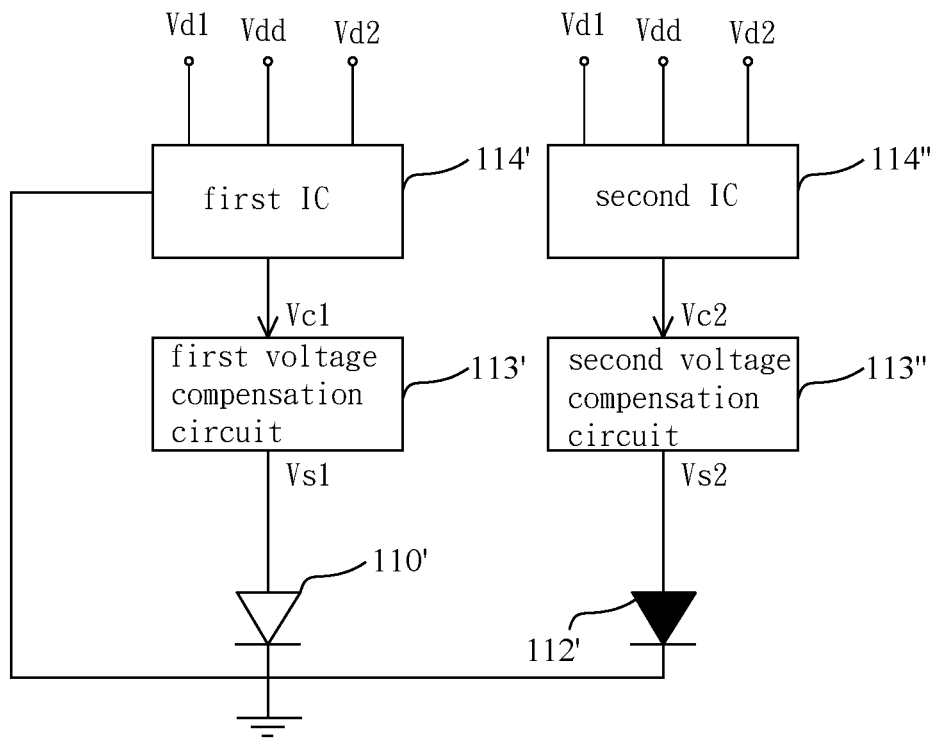
FIG. 37 is a diagram schematically illustrating an equivalent circuit corresponding to FIG. 36 according to the first embodiment of the present invention.

FIG. 35 is a perspective view of a first IC, a second IC, a first voltage compensation circuit, and a second voltage compensation circuit on a first package substrate and a second package substrate according to an embodiment of the present invention. FIG. 36 is a perspective view of a LED, a backup LED, a first IC, a second IC, a first voltage compensation circuit, a second voltage compensation circuit, a first package substrate, and a second package substrate on the driving backplane according to an embodiment of the present invention. FIG. 37 is a diagram schematically illustrating an equivalent circuit corresponding to FIG. 36 according to the first embodiment of the present invention. Referring to FIG. 35, FIG. 36, and FIG. 37, one light-emitting diode 110', one conductive position 1111', and one conductive vacant position 1112' of each pixel unit 11' are used to describe the structure of the light-emitting diode display 1'. In another embodiment of the present invention, each pixel unit 11' further includes at least one first voltage compensation circuit 113', at least one second voltage compensation circuit 113", a first IC 114', and a second IC 114". In the fourth embodiment, the numbers of the light-emitting diode 110' and the first voltage compensation circuit 113' of the pixel unit 11 are equal. The first IC 114' is arranged between the first package substrate 111' and the first voltage compensation circuit 113' and arranged at the conductive position 1111'. The first voltage compensation circuit 113' is arranged between the first IC 114' and the light-emitting diode 110' and directly arranged over the conductive position 1111'. The positions of the first IC 114' and the first voltage compensation circuit 113' are not limited. In some embodiments of the present invention, the first IC 114' and the first voltage compensation circuit 113' may be directly arranged on the surface of the first package substrate 111'. The light-emitting diode 110' is electrically connected to the conductive position 1111' through the first voltage compensation circuit 113' and the first IC 114'. The first IC 114' is configured to generate at least one first control voltage Vc1. The first voltage compensation circuit 113' is configured to receive the first control voltage Vc1 and perform voltage compensation on the first control voltage Vc1 to generate at least one first display voltage Vs1. The first voltage compensation circuit 113' transmits the first display voltage Vs1 to the light-emitting diode 110'. For example, the numbers of the first control voltage Vc1, the first display voltage Vs1, the light-emitting diode 110' of the pixel unit 11' are equal. Since the current corresponding to the first control voltage Vc1 is affected by the threshold voltage and the mobility of the thin-film transistor, the driving voltage of the light-emitting diode 110', and the voltage of power supply, the first voltage compensation circuit 113' may include capacitors, resistors, and inductors to eliminate influence caused by these factors, such as the variation of the threshold voltage of the thin-film transistor, the voltage drop across the conductive trace, and the shift of the threshold voltage of the light-emitting diode 110'.

In the fourth embodiment, the numbers of the conductive vacant position 1112' and the second voltage compensation circuit 113" of the pixel unit 11 are equal. The second IC 114" is arranged between the second package substrate 111" and the second voltage compensation circuit 113" and arranged at the conductive vacant position 1112'. The second voltage compensation circuit 113" is arranged on the second IC 114" and directly arranged over the conductive vacant position 1112'. The positions of the second IC 114" and the second voltage compensation circuit 113" are not limited. In some embodiments of the present invention, the second IC 114" and the second voltage compensation circuit 113" may be directly arranged on the surface of the second package substrate 111". The second voltage compensation circuit 113" is electrically connected to the conductive vacant position 1112' through the second IC 114". The second IC 114" is configured to generate at least one second control voltage Vc2. The second voltage compensation circuit 113" is configured to receive the second control voltage Vc2 and perform voltage compensation on the second control voltage Vc2 to generate at least one second display voltage Vs2. The second voltage compensation circuit 113" transmits the second display voltage Vs2 to the conductive vacant position 1112'. For example, the numbers of the second control voltage Vc2, the display voltage Vs2, the conductive vacant position 1112' of the pixel unit 11' are equal. The function of the second voltage compensation circuit 113" is the same to that of the first voltage compensation circuit 113' so will not be reiterated.

Specifically, the conductive position 1111' may have a first cathode c1' and the conductive vacant position 1112' may have a second cathode c2'. The conductive position 1111' is provided with and electrically connected to the first IC 114'. The conductive vacant position 1112' is provided with and electrically connected to the second IC 114". The first IC 114' is provided with and electrically connected to the first voltage compensation circuit 113' thereon. The top surface of the first voltage compensation circuit 113' has a fourth anode a4'. The second IC 114" is provided with and electrically connected to the second voltage compensation circuit 113" thereon. The top surface of the second voltage compensation circuit 113" has a fifth anode a5'. The light-emitting diode 110' may be respectively arranged on the fourth anode a4' and the first cathode c1' through a first conductive pad 115' and a second conductive pad 116'. The light-emitting diode 110' is electrically connected to the fourth anode a4' and the first cathode c1'. In other words, the conductive pads of the light-emitting diode 110' are arranged at the same side. The driving backplane 10' has a first driver IC 101' and a second driver IC 102'. The first driver IC 101' is electrically connected to the first package substrate 111', the second package substrate 111", the first IC 114', and the second IC 114". The first driver IC 101' provides a first driving voltage Vd1 for the first IC 114' and the second IC 114". The second driver IC 102' is electrically connected to the first package substrate 111', the second package substrate 111", the first IC 114', and the second IC 114". The second driver IC 102' provides a second driving voltage Vd2 for the first IC 114' and the second IC 114". Since the driving backplane 10' receives a power voltage Vdd and a grounding voltage GND, the driving backplane 10' transmits the power voltage Vdd and the grounding voltage GND to the first IC 114' and the second IC 114" and transmits the grounding voltage GND to the light-emitting diode 110'. The first IC 114' generates the first control voltage Vc1 in response to the first driving voltage Vd1, the second driving voltage Vd2, and the power voltage Vdd. The second IC 114" generates the second control voltage Vc2 in response to the first driving voltage Vd1, the second driving voltage Vd2, and the power voltage Vdd. When the light-emitting diode 110' fails, the light-emitting diode display 1' may further include at least one backup light-emitting diode 112' that is arranged at the conductive vacant position 1112' corresponding to the failed light-emitting diode 110'. The driving backplane 10' is electrically connected to the backup light-emitting diode 112' thereon. Specifically, the backup light-emitting diode 112' may be respectively arranged on the fifth anode a5' and the second cathode c2' through a third conductive pad 117' and a fourth conductive pad 118'. The backup light-emitting diode 112' is electrically connected to the fifth anode a5' and the second cathode c2'. In other words, the conductive pads of the backup light-emitting diode 112' are also arranged at the same side.

Figure 38A:
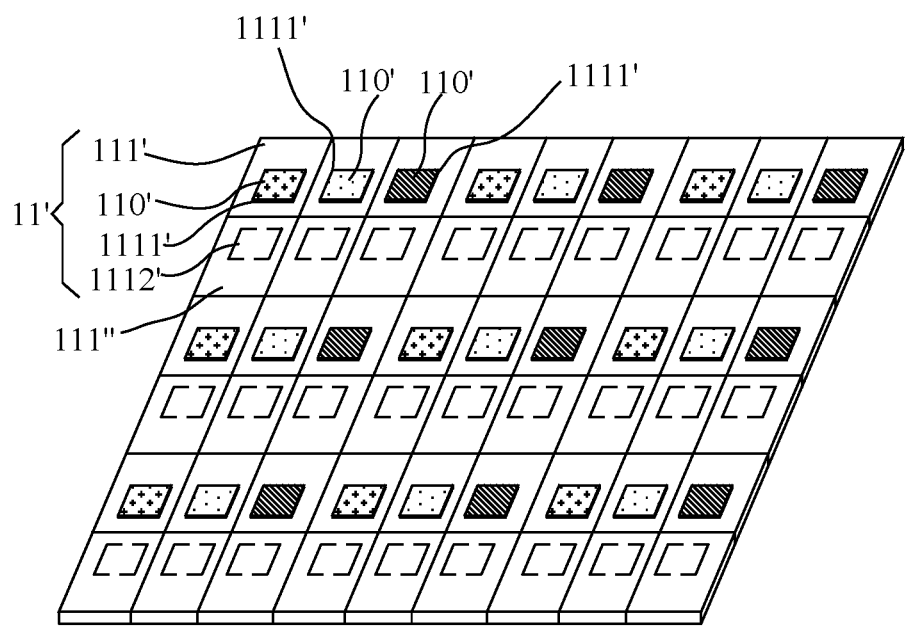
FIGS. 38(a)-38(c) are diagrams schematically illustrating the step of fabricating a LED display according to the fourth embodiment of the present invention.
Figure 38B:
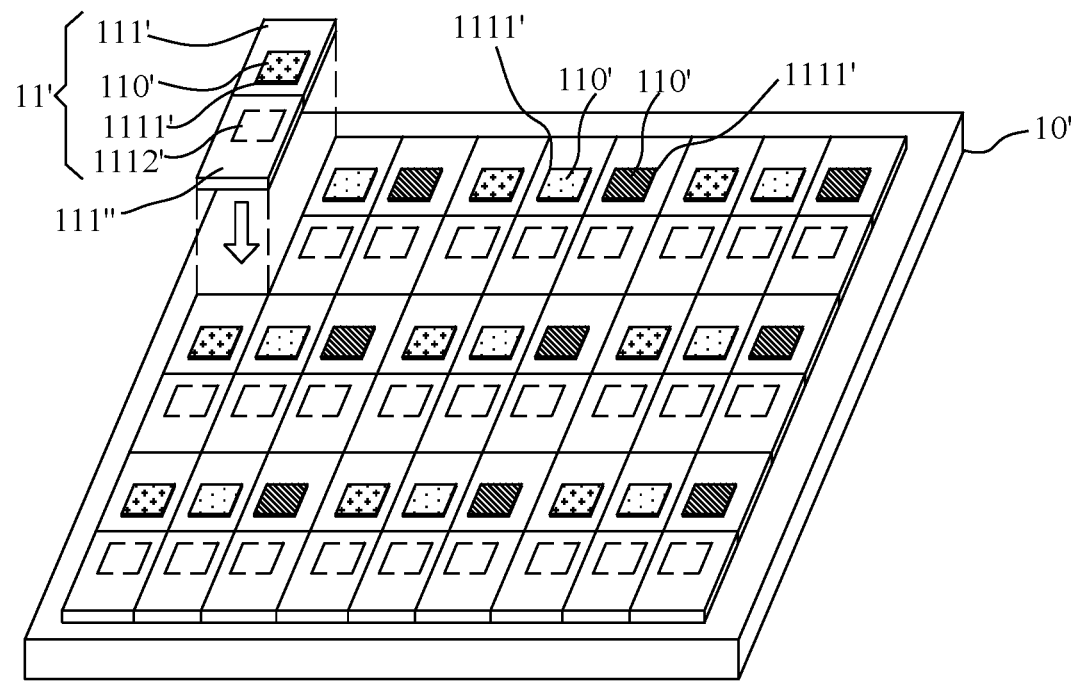
Figure 38C:
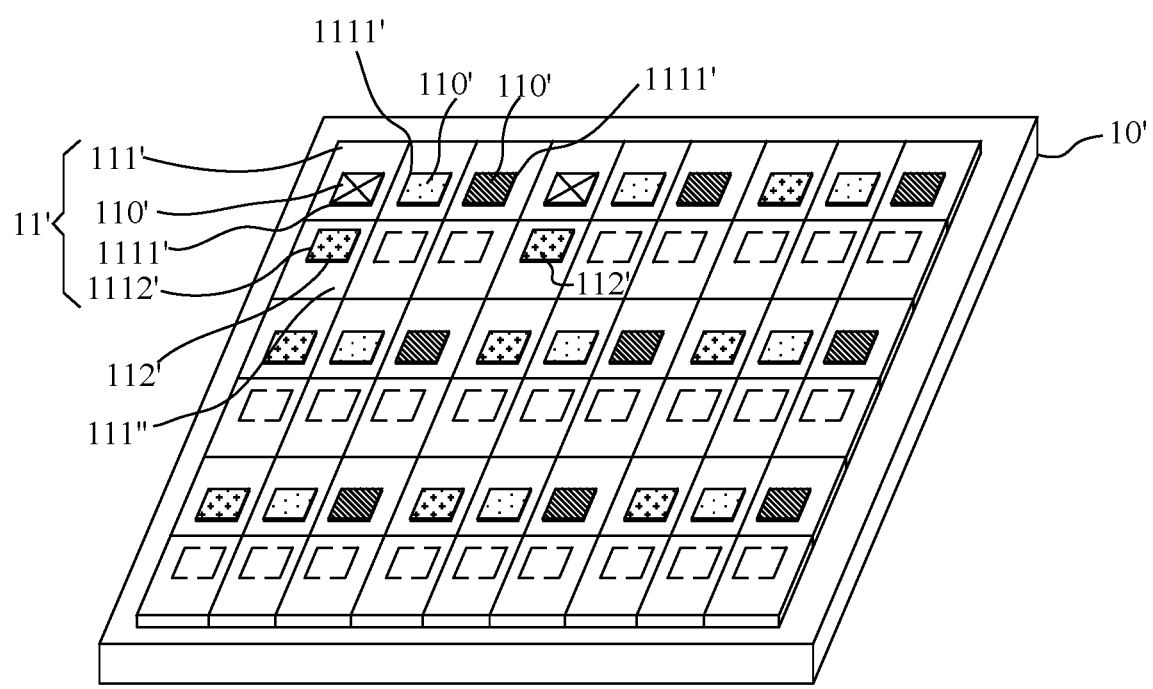

FIGS. 38(a)-38(c) are diagrams schematically illustrating the step of fabricating a LED display according to the fourth embodiment of the present invention. Referring to FIGS. 38(a)-38(c), the method for fabricating the LED display according to the fourth embodiment of the present invention is introduced as follows. As illustrated in FIG. 38(a), a plurality of pixel units 11' is provided. Each pixel unit 11' includes a first package substrate 111', a second package substrate 111", and at least one light-emitting diode 110'. The top surface of the first package substrate 111' has at least one conductive position 1111'. The top surface of the second package substrate 111" has at least one conductive vacant position 1112'. The conductive position 1111' is provided with and electrically connected to the light-emitting diode 110'. In the fourth embodiment, one light-emitting diode 110', one conductive position 1111', and one conductive vacant position 1112' of each pixel unit 11' are used. Assume that all the light-emitting diodes 110', all the first package substrates 111', and all the second package substrates 111" are normal. As illustrated in FIG. 38(b), the bottom surfaces of a part of the first package substrates 111' and a part of the second package substrates 111" are transferred to the driving backplane 10', such that the driving backplane 10' is electrically connected to the light-emitting diodes 110' thereon and the corresponding conductive vacant positions 1112'. Alternatively, the bottom surfaces of the first package substrate 111' and the second package substrate 111" of each pixel unit 11' is transferred to the driving backplane 10', such that the driving backplane 10' is electrically connected to the conductive vacant position 1112' and the light-emitting diode 110' of each pixel unit 11'. If the normality of all the light-emitting diodes 110' and all the first package substrates 111' is not determined, a voltage is applied to the first package substrates 111' to determine whether the first package substrate 111' and the light-emitting diode 110' thereon of each pixel unit 11' are normal after providing all the pixel units 11'. If the first package substrate 111' and the light-emitting diode 110' thereon of each pixel unit 11' are normal, the bottom surface of the normal first package substrate 111' is transferred to the driving backplane 10' and the driving backplane 10' is electrically connected to the light-emitting diode 110' thereon and the corresponding conductive vacant position 1112'. If the first package substrate 111' and the light-emitting diode 110' thereon of each pixel unit 11' are not normal, the abnormal first package substrate 111' separates from the driving backplane 10'. Finally, the process determines whether the light-emitting diode 110' electrically connected to the driving backplane 10' emits light. If the light-emitting diode 110' electrically connected to the driving backplane 10' does not emit light, at least one backup light-emitting diode 112' is transferred to the conductive vacant position 1112' and the driving backplane 10' is electrically connected to the backup light-emitting diode 112' thereon, as illustrated in FIG. 38(c). If the light-emitting diode 110' electrically connected to the driving backplane 10' emits light, the process ends.

The processes of forming the backup light-emitting diode 112' on the second package substrates 111" and providing all the pixel units 11' of the fourth embodiment are different from the processes of the first embodiment in the structure of the pixel unit so will not be reiterated.

Figure 39:
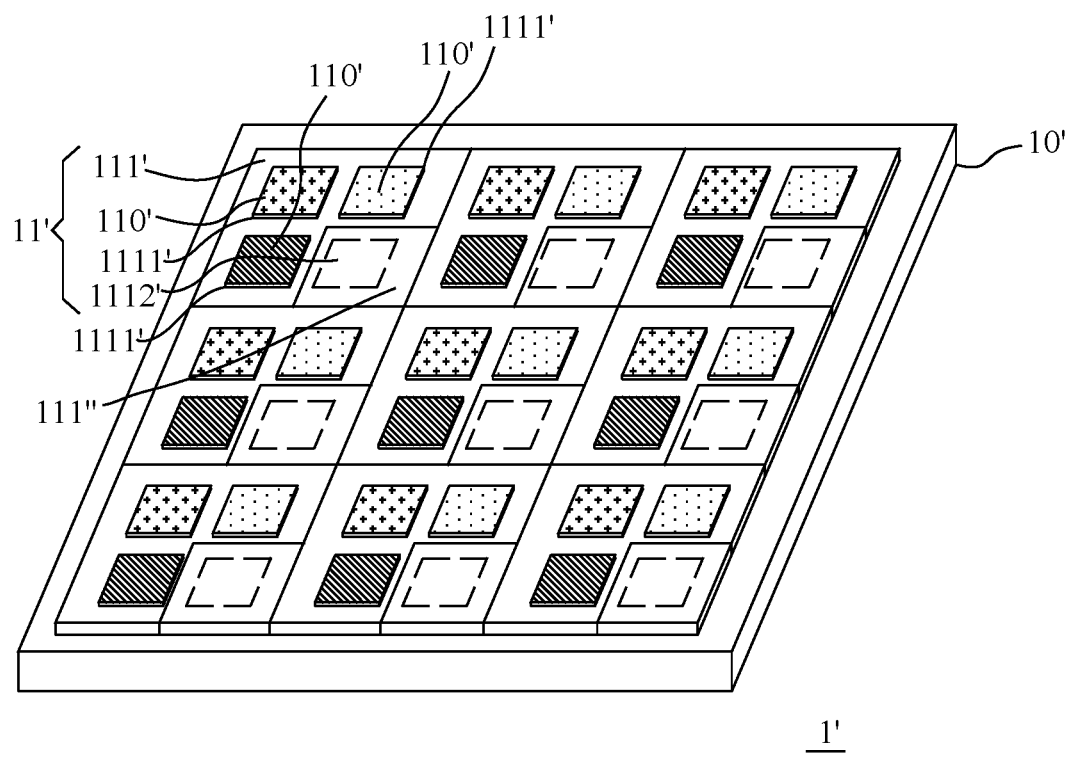
FIG. 39 is a perspective view of a light-emitting diode display according to a fifth embodiment of the present invention.

FIG. 39 is a perspective view of a light-emitting diode display according to a fifth embodiment of the present invention. Referring to FIG. 39, the fifth embodiment is different from the fourth embodiment in the numbers of the light-emitting diodes 110' and the conductive positions 1111' of the same pixel unit 11'. In the fifth embodiment, there are the plurality of light-emitting diodes 110' and the plurality of conductive positions 1111' of the same pixel unit 11'. All the light-emitting diodes 110' are respectively arranged at and electrically connected to all the conductive positions 1111'. The number of all the light-emitting diodes 110' is equal to the number of all the conductive positions 1111'. The light-emitting diodes 110' include red light-emitting diodes, green light-emitting diodes, and blue light-emitting diodes, but the present invention is not limited thereto.

Figure 40:
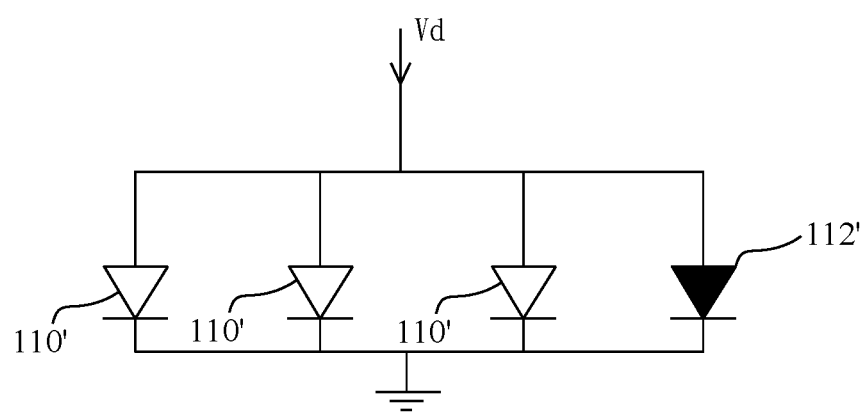
FIG. 40 is a diagram schematically illustrating an equivalent circuit corresponding to FIG. 33 according to the fifth embodiment of the present invention.

FIG. 40 is a diagram schematically illustrating an equivalent circuit corresponding to FIG. 33 according to the fifth embodiment of the present invention. Referring to FIG. 30, FIG. 31, FIG. 32, FIG. 33, and FIG. 40, light-emitting diodes 110', conductive positions 1111', and one conductive vacant position 1112' of each pixel unit 11' are used to describe the structure of the light-emitting diode display 1'. The structure of the fifth embodiment is similar to that of the fourth embodiment. Thus, the difference between the fifth embodiment and the fourth embodiment is introduced as follows. In the fifth embodiment, each conductive position 1111' may have a first anode A1' and a first cathode C1'. All the first anodes A1' are respectively electrically connected to all the third anodes A3'. All the first cathodes C1' are electrically connected to the first common cathode COM1'. All the third anodes A3' are respectively electrically connected to all the fifth anodes A5'. The driver IC 100' is electrically connected to all the first anodes A1', the second anode A2', all the third anodes A3', the fourth anode A4', all the fifth anodes A5', the sixth anode A6', and all the light-emitting diodes 110'. The driver IC 100' provides the driving voltage Vd for all the light-emitting diodes 110' and the second anode A2'.

Figure 41:
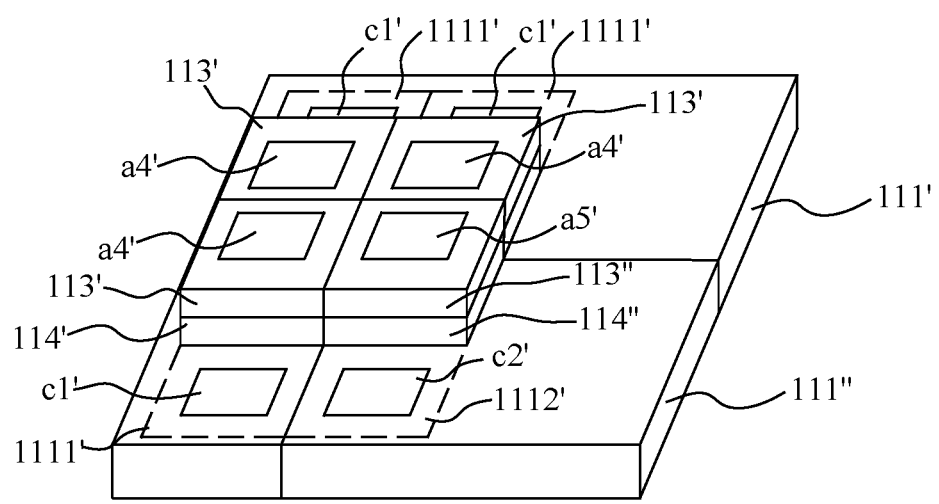
FIG. 41 is a perspective view of a first IC, a second IC, a first voltage compensation circuit, and a second voltage compensation circuit on a first package substrate and a second package substrate according to another embodiment of the present invention.
Figure 42:
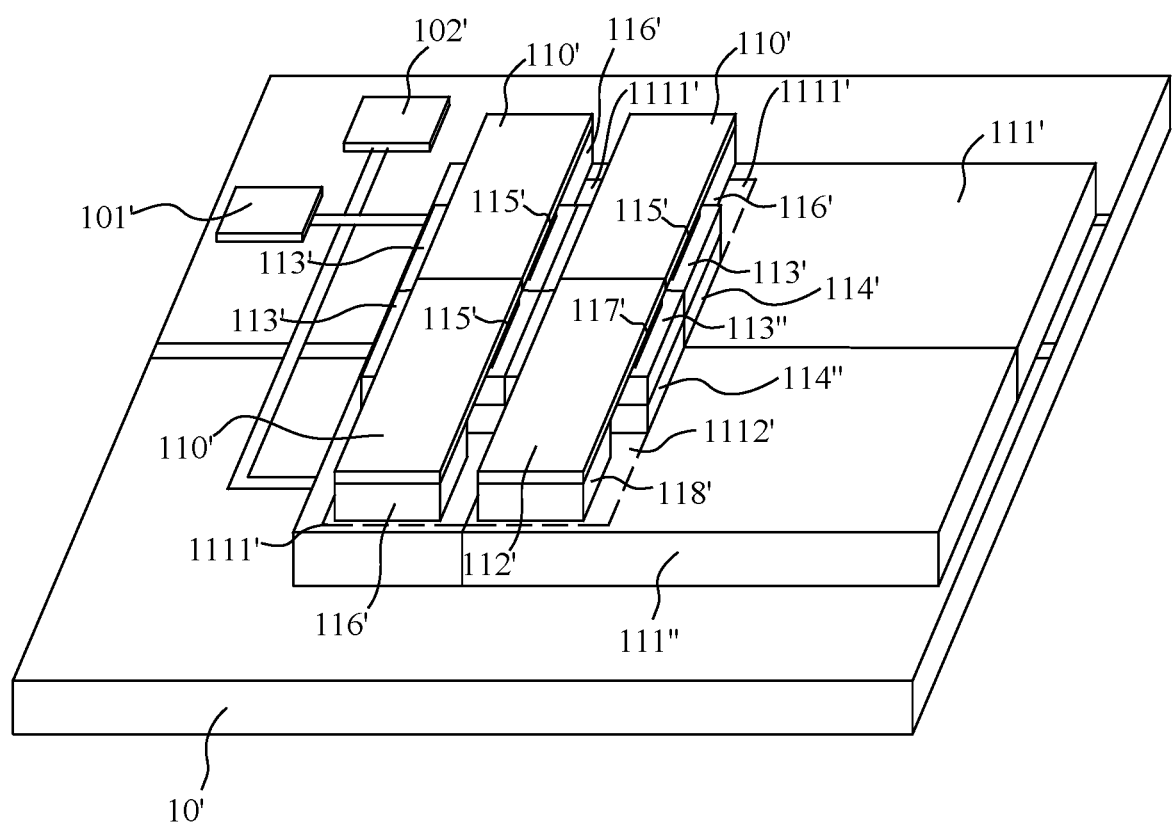
FIG. 42 is a perspective view of a LED, a backup LED, a first IC, a second IC, a first voltage compensation circuit, a second voltage compensation circuit, a first package substrate, and a second package substrate on the driving backplane according to another embodiment of the present invention.
Figure 43:
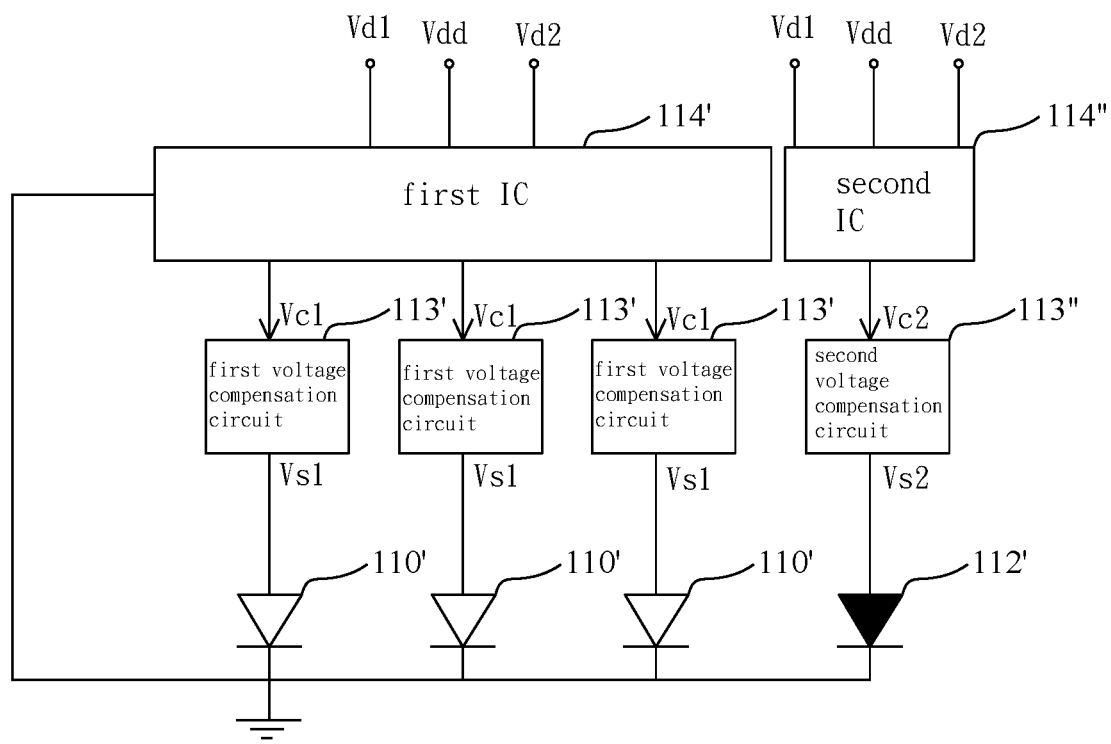
FIG. 43 is a diagram schematically illustrating an equivalent circuit corresponding to FIG. 42 according to the fifth embodiment of the present invention.

FIG. 41 is a perspective view of a first IC, a second IC, a first voltage compensation circuit, and a second voltage compensation circuit on a first package substrate and a second package substrate according to another embodiment of the present invention. FIG. 42 is a perspective view of a LED, a backup LED, a first IC, a second IC, a first voltage compensation circuit, a second voltage compensation circuit, a first package substrate, and a second package substrate on the driving backplane according to another embodiment of the present invention. FIG. 43 is a diagram schematically illustrating an equivalent circuit corresponding to FIG. 42 according to the fifth embodiment of the present invention. Referring to FIG. 41, FIG. 42, and FIG. 43, light-emitting diodes 110', conductive positions 1111', and one conductive vacant position 1112' of each pixel unit 11' are used to describe the structure of the light-emitting diode display 1'. The structure of the fifth embodiment is similar to that of the fourth embodiment. Thus, the difference between the fifth embodiment and the fourth embodiment is introduced as follows. In the fifth embodiment, all the first voltage compensation circuits 113' are arranged between the first IC 114' and all the light-emitting diodes 110' and respectively directly arranged over the conductive positions 1111'. All the light-emitting diodes 110' are respectively arranged on all the first voltage compensation circuits 113'. The light-emitting diodes 110' are respectively electrically connected to the conductive positions 1111' through the first voltage compensation circuits 113' and the first IC 114'.

Specifically, each conductive position 1111' may have a first cathode c1' and all the conductive positions 1111' are provided with and electrically connected to the first IC 114'. The first IC 114' is provided with and electrically connected to all the first voltage compensation circuits 113' thereon. The top surface of each first voltage compensation circuit 113' has a fourth anode a4'.

The method for fabricating the LED display according to the fifth embodiment of the present invention is introduced as follows. The method for fabricating the LED display of the fifth embodiment of the present invention is different from the method for fabricating the LED display of the fourth embodiment of the present invention in the structure of the pixel unit 11. The remaining features of the method of the fifth embodiment are the same to those of the fourth embodiment so will not be reiterated. Since each package substrate 111 of the fifth embodiment is provided with the light-emitting diodes 110, the times of transferring the light-emitting diodes 110 are decreased and the successful rate of transferring the light-emitting diodes 110 is increased.

Figure 44:
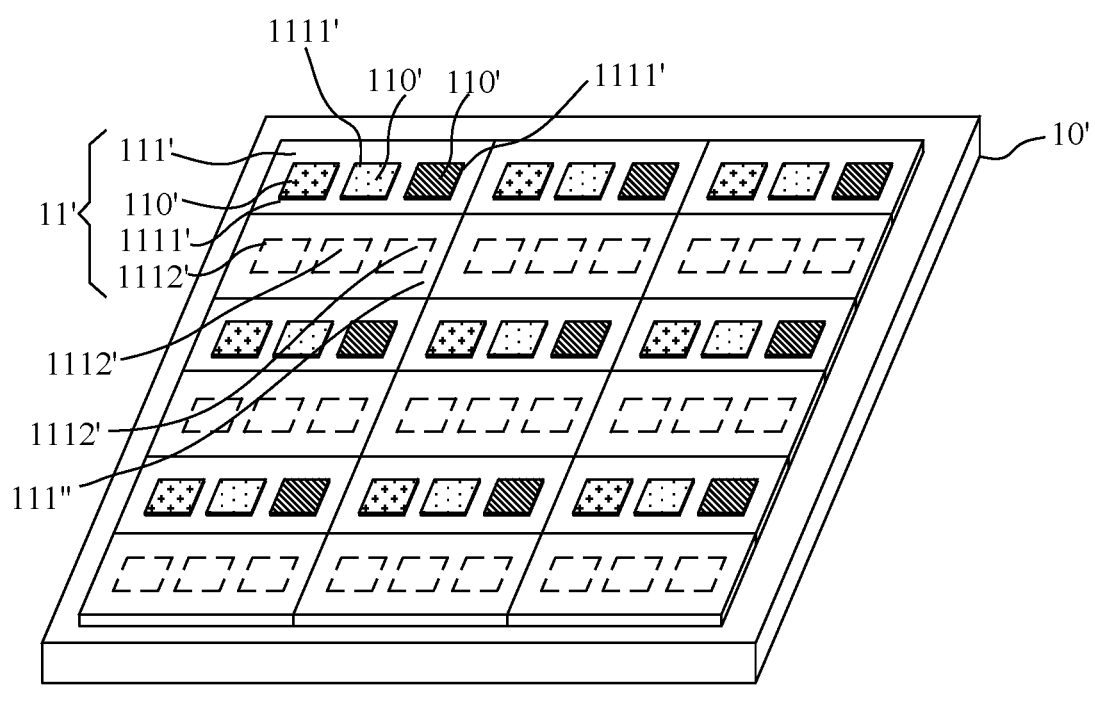
FIG. 44 is a perspective view of a light-emitting diode display according to a sixth embodiment of the present invention.

FIG. 44 is a perspective view of a light-emitting diode display according to a sixth embodiment of the present invention. Referring to FIG. 44, the light-emitting diode display 1' according to the sixth embodiment of the present invention is introduced as follows. The sixth embodiment is different from the fourth embodiment in the numbers of the conductive positions 1111', the conductive vacant positions 1112', and the corresponding components. In the sixth embodiment, there are conductive positions 1111', conductive vacant positions 1112', and light-emitting diodes 110'. The light-emitting diodes 110' are respectively arranged at and electrically connected to the conductive positions 1111'. The number of the light-emitting diodes 110' is equal to the number of the conductive positions 1111'. The light-emitting diodes 110' include red light-emitting diodes, green light-emitting diodes, and blue light-emitting diodes. The conductive vacant positions 1112' respectively correspond to the conductive positions 1111'. The number of the conductive vacant positions 1112' is equal to the number of the conductive positions 1111'.

Figure 45:
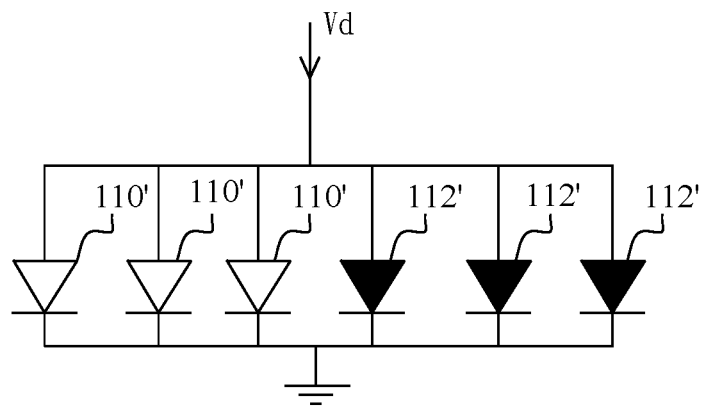
FIG. 45 is a diagram schematically illustrating an equivalent circuit corresponding to FIG. 33 according to the sixth embodiment of the present invention.

FIG. 45 is a diagram schematically illustrating an equivalent circuit corresponding to FIG. 33 according to the sixth embodiment of the present invention. Referring to FIG. 30, FIG. 31, FIG. 32, FIG. 33, and FIG. 45, light-emitting diodes 110', conductive positions 1111', and conductive vacant positions 1112' of each pixel unit 11' are used to describe the structure of the light-emitting diode display 1'. However, the connecting and structural relations of the components of the sixth embodiment are the same to those of the components of the fourth embodiment so will not be reiterated.

Figure 46:
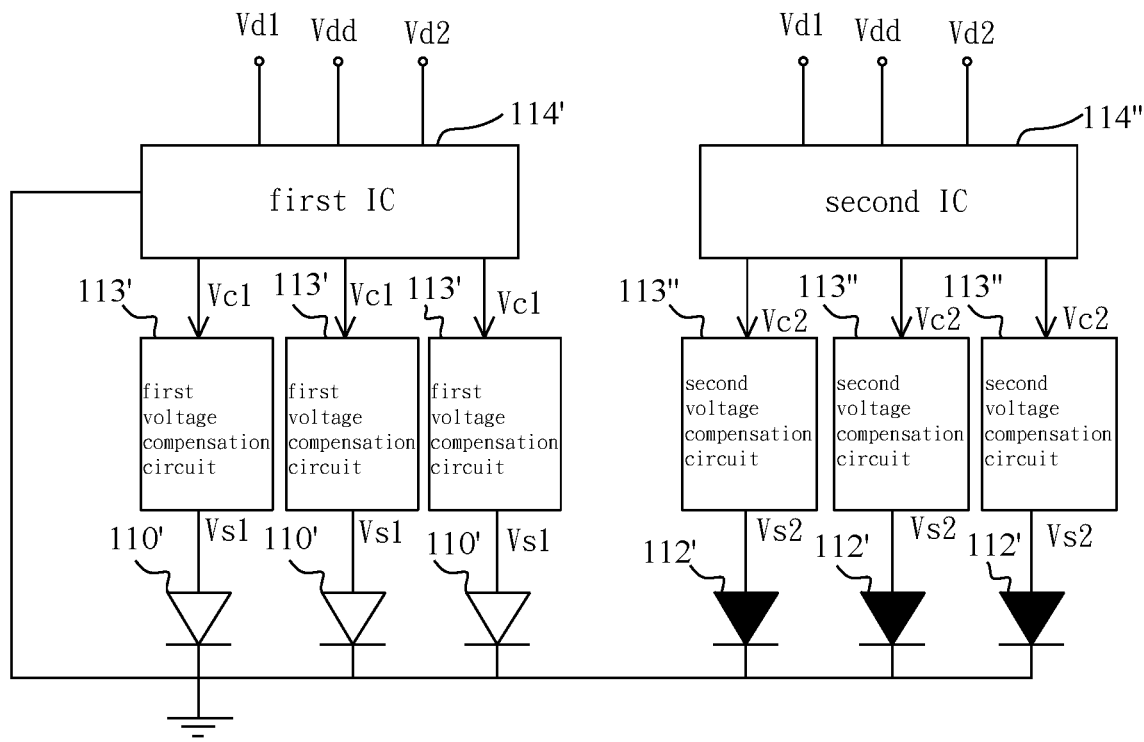
FIG. 46 is a diagram schematically illustrating an equivalent circuit corresponding to FIG. 36 according to the sixth embodiment of the present invention.

FIG. 46 is a diagram schematically illustrating an equivalent circuit corresponding to FIG. 36 according to the sixth embodiment of the present invention. Referring to FIG. 35, FIG. 36, and FIG. 46, light-emitting diodes 110', first voltage compensation circuits 113', second voltage compensation circuits 113", conductive positions 1111', and conductive vacant positions 1112" of each pixel unit 11' are used to describe the structure of the light-emitting diode display 1'. However, the connecting and structural relations of the components of the sixth embodiment are the same to those of the components of the fourth embodiment so will not be reiterated.

The method for fabricating the LED display according to the sixth embodiment of the present invention is introduced as follows. The method for fabricating the LED display of the sixth embodiment of the present invention is different from the method for fabricating the LED display of the fourth embodiment of the present invention in the structure of the pixel unit 11'. The remaining features of the method of the sixth embodiment are the same to those of the fourth embodiment so will not be reiterated. Since each first package substrate 111' of the sixth embodiment is provided with the light-emitting diodes 110', the times of transferring the light-emitting diodes 110' are decreased and the successful rate of transferring the light-emitting diodes 110' is increased.

According to the embodiments provided above, the light-emitting diode display and the method for fabricating the same arrange the package substrate between the driving backplane and LEDs and transfer the circuit of the driving backplane to the package substrate to increase the utilization of light emitting areas and have applications of high-resolution products. Besides, the package substrate can transfer many LEDs to the driving backplane to decrease the transferring times and increase the transferring success rate.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A light-emitting diode display comprising:
a driving backplane; and
a plurality of pixel units, wherein each of the plurality of pixel units comprises:
at least one light-emitting diode; and
at least one package substrate with a top surface thereof having at least one conductive position and at least one conductive vacant position, wherein the at least one conductive vacant position corresponds to the at least one conductive position, the at least one conductive position is provided with a corresponding the at least one light-emitting diode, the at least one conductive position is electrically connected to a corresponding the at least one light-emitting diode, a bottom surface of the at least one package substrate of each of the plurality of pixel units is arranged on the driving backplane, and the driving backplane is electrically connected to the at least one light-emitting diode and a corresponding the at least one conductive vacant position of each of the plurality of pixel units thereon;
wherein the at least one package substrate comprises a first package substrate and a second package substrate, a top surface of the first package substrate has the at least one conductive position, a top surface of the second package substrate has the at least one conductive vacant position, bottom surfaces of the first package substrate and the second package substrate are arranged on the driving backplane, and the driving backplane is electrically connected to the at least one light-emitting diode thereon and a corresponding the at least one conductive vacant position;
wherein each of the plurality of pixel units further comprises at least one first voltage compensation circuit and a first integrated circuit, the first integrated circuit is arranged between the at least one first package substrate and the at least one first voltage compensation circuit and arranged at the at least one conductive position, the at least one first voltage compensation circuit is arranged between the first integrated circuit and the at least one light-emitting diode and arranged directly above the at least one conductive position, the at least one light-emitting diode is electrically connected to the at least one conductive position through the at least one first voltage compensation circuit and the first integrated circuit, the first integrated circuit is configured to generate at least one first control voltage, and the at least one first voltage compensation circuit is configured to receive the at least one first control voltage, perform voltage compensation on the at least one first control voltage to generate at least one first display voltage, and transmit the at least one first display voltage to the at least one light-emitting diode.

2. The light-emitting diode display according to claim 1, wherein the at least one light-emitting diode is a red light-emitting diode, a green light-emitting diode, or a blue light-emitting diode.

3. The light-emitting diode display according to claim 1, further comprising at least one backup light-emitting diode arranged at the at least one conductive vacant position and electrically connected to the driving backplane.

4. The light-emitting diode display according to claim 1, wherein the at least one conductive position comprises a plurality of conductive positions, the at least one light-emitting diode comprises a plurality of light-emitting diodes, the plurality of light-emitting diodes are respectively arranged at the plurality of conductive positions and respectively electrically connected to the plurality of conductive positions, and number of the plurality of light-emitting diodes is equal to number of the plurality of conductive positions.

5. The light-emitting diode display according to claim 4, wherein the plurality of light-emitting diodes comprise red light-emitting diodes, green light-emitting diodes, and blue light-emitting diodes.

6. The light-emitting diode display according to claim 4, wherein the at least one conductive vacant position comprises a plurality of conductive vacant positions, the plurality of conductive vacant positions respectively correspond to the plurality of conductive positions, and number of the plurality of conductive vacant positions is equal to number of the plurality of conductive positions.

7. The light-emitting diode display according to claim 1, wherein the at least one light-emitting diode is a mini light-emitting diode or a micro light-emitting diode.

8. The light-emitting diode display according to claim 1, wherein each of the plurality of pixel units further comprises at least one second voltage compensation circuit and a second integrated circuit, the second integrated circuit is arranged between the at least one second package substrate and the at least one second voltage compensation circuit and arranged at the at least one conductive vacant position, the at least one second voltage compensation circuit is arranged on the second integrated circuit and arranged directly above the at least one conductive vacant position, the at least one second voltage compensation circuit is electrically connected to a corresponding the at least one conductive vacant position through the second integrated circuit, the second integrated circuit is configured to generate at least one second control voltage, and the at least one second voltage compensation circuit is configured to receive the at least one second control voltage, perform voltage compensation on the at least one second control voltage to generate at least one second display voltage, and transmit the at least one second display voltage to the at least one conductive vacant position.

9. A method for fabricating a light-emitting diode display comprising:
providing a plurality of pixel units, wherein each of the plurality of pixel units comprises at least one package substrate and at least one light-emitting diode, a top surface of the at least one package substrate has at least one conductive position and at least one conductive vacant position, the at least one conductive vacant position corresponds to the at least one conductive position, the at least one conductive position is provided with a corresponding the at least one light-emitting diode, and the at least one conductive position is electrically connected to a corresponding the at least one light-emitting diode; and
transferring a bottom surface of the at least one package substrate to a driving backplane and electrically connecting the driving backplane to the at least one light-emitting diode thereon and a corresponding the at least one conductive vacant position;
wherein the at least one package substrate comprises a first package substrate and a second package substrate, a top surface of the first package substrate has the at least one conductive position, a top surface of the second package substrate has the at least one conductive vacant position, and in the step of transferring the bottom surface of the at least one package substrate to the driving backplane, bottom surfaces of the first package substrate and the second package substrate are transferred to the driving backplane;
wherein each of the plurality of pixel units further comprises at least one first voltage compensation circuit and a first integrated circuit, the first integrated circuit is arranged between the at least one first package substrate and the at least one first voltage compensation circuit and arranged at the at least one conductive position, the at least one first voltage compensation circuit is arranged between the first integrated circuit and the at least one light-emitting diode and arranged directly above the at least one conductive position, the at least one light-emitting diode is electrically connected to the at least one conductive position through the at least one first voltage compensation circuit and the first integrated circuit, the first integrated circuit is configured to generate at least one first control voltage, and the at least one first voltage compensation circuit is configured to receive the at least one first control voltage, perform voltage compensation on the at least one first control voltage to generate at least one first display voltage, and transmit the at least one first display voltage to the at least one light-emitting diode.

10. The method for fabricating a light-emitting diode display according to claim 9, wherein after the step of providing the plurality of pixel units, determining whether the at least one package substrate and the at least one light-emitting diode thereon of each of the plurality of pixel units are normal: if yes, transferring the bottom surface of a normal the at least one package substrate to the driving backplane and electrically connecting the driving backplane to the at least one light-emitting diode thereon and a corresponding the at least one conductive vacant position; and if no, separating abnormal the at least one package substrate from the driving backplane.

11. The method for fabricating a light-emitting diode display according to claim 9, wherein in the step of transferring the bottom surface of a normal the at least one package substrate to the driving backplane and electrically connecting the driving backplane to the at least one light-emitting diode thereon and a corresponding the at least one conductive vacant position, the bottom surface of the at least one package substrate of each of the plurality of pixel units to the driving backplane and the driving backplane is electrically connected to the at least one conductive vacant position of each of the plurality of pixel units and the at least one light-emitting diode of each of the plurality of pixel units.

12. The method for fabricating a light-emitting diode display according to claim 9, wherein the at least one light-emitting diode is a red light-emitting diode, a green light-emitting diode, or a blue light-emitting diode.

13. The method for fabricating a light-emitting diode display according to claim 9, further comprising:
   determining whether the at least one light-emitting diode electrically connected to the driving backplane emits light:
      if no, transferring at least one backup light-emitting diode to the at least one conductive vacant position and electrically connecting the driving backplane to the at least one backup light-emitting diode thereon; and
      if yes, ending.

14. The method for fabricating a light-emitting diode display according to claim 9, wherein the at least one conductive position comprises a plurality of conductive positions, the at least one light-emitting diode comprises a plurality of light-emitting diodes, the plurality of light-emitting diodes are respectively arranged at the plurality of conductive positions and respectively electrically connected to the plurality of conductive positions, and number of the plurality of light-emitting diodes is equal to number of the plurality of conductive positions.

15. The method for fabricating a light-emitting diode display according to claim 14, wherein the plurality of light-emitting diodes comprise red light-emitting diodes, green light-emitting diodes, and blue light-emitting diodes.

16. The method for fabricating a light-emitting diode display according to claim 14, wherein the at least one conductive vacant position comprises a plurality of conductive vacant positions, the plurality of conductive vacant positions respectively correspond to the plurality of conductive positions, and number of the plurality of conductive vacant positions is equal to number of the plurality of conductive positions.

17. The method for fabricating a light-emitting diode display according to claim 9, wherein the at least one light-emitting diode is a mini light-emitting diode or a micro light-emitting diode.

* * * * *